United States Patent
Ueno et al.

(10) Patent No.: US 6,734,523 B2
(45) Date of Patent: May 11, 2004

(54) SEMICONDUCTOR DEVICE INCLUDING A WELL DIVIDED INTO A PLURALITY OF PARTS BY A TRENCH

(75) Inventors: Shuuichi Ueno, Tokyo (JP); Tomohiro Yamashita, Tokyo (JP); Hidekazu Oda, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 09/395,184

(22) Filed: Sep. 14, 1999

(65) Prior Publication Data

US 2002/0149080 A1 Oct. 17, 2002

(30) Foreign Application Priority Data

Apr. 5, 1999 (JP) .......................... P11-097417

(51) Int. Cl.[7] .................. H01L 29/00; H01L 29/76; H01L 27/11
(52) U.S. Cl. .................. 257/510; 257/374; 257/903
(58) Field of Search .................. 257/374, 376, 257/373, 510, 513, 515, 204, 206, 903; 438/207, 424, 430

(56) References Cited

U.S. PATENT DOCUMENTS

| 4,566,914 A | * | 1/1986 | Hall | 257/513 |
| 4,935,800 A | * | 6/1990 | Taguchi | 257/513 |
| 5,371,023 A | * | 12/1994 | Minami et al. | 438/207 |
| 5,801,423 A | * | 9/1998 | Manning | 257/510 |
| 5,877,066 A | * | 3/1999 | Stolmeijer et al. | 438/424 |

FOREIGN PATENT DOCUMENTS

JP        10-22462        *   1/1998        .................. 257/376

OTHER PUBLICATIONS

M. Nandakumar, et al. "A Shallow Trench Isolation for Sub-0.13μm CMOS Technologies", IEDM, 1997, pp. 657–660.

* cited by examiner

Primary Examiner—Steven Loke
(74) Attorney, Agent, or Firm—Oblon, Spivak, McClelland, Maier & Neustadt, P.C.

(57) ABSTRACT

A semiconductor device including a well divided into a plurality of parts by a trench, to effect a reduction in layout area, and a manufacturing method thereof. In the semiconductor device, an element isolation film is formed such as to have to a depth from the main surface of a semiconductor substrate, and the area from the main surface of the substrate to the depth is divided into a plurality of first regions. A first well is formed in each of the first regions. A second well is formed in a second region deeper than the first well in the substrate, and the second well is in contact with some of the first wells.

9 Claims, 23 Drawing Sheets

F I G . 15
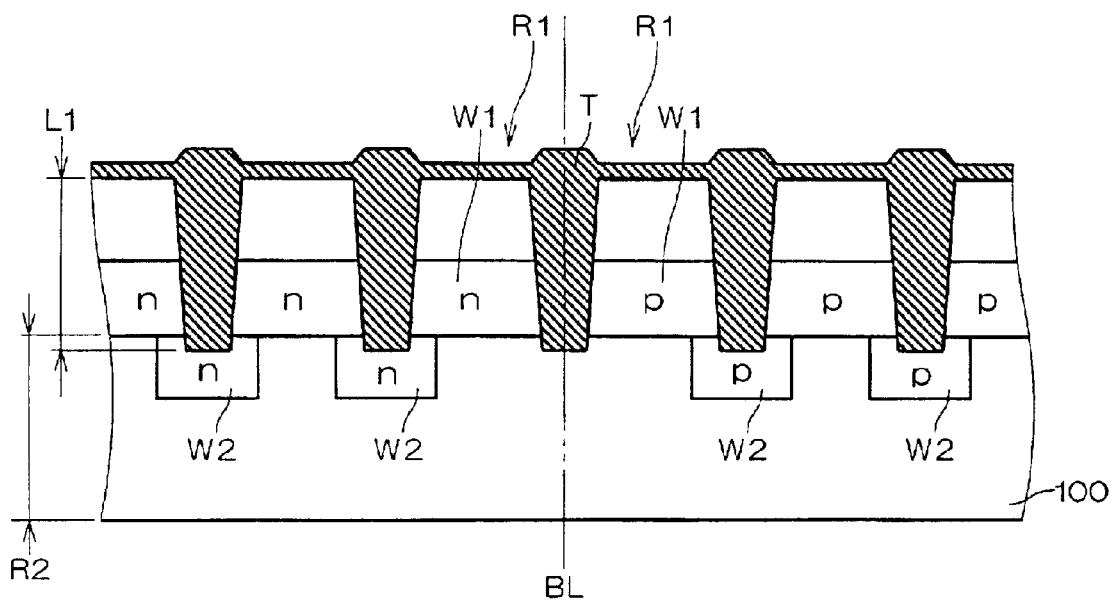
F I G . 16
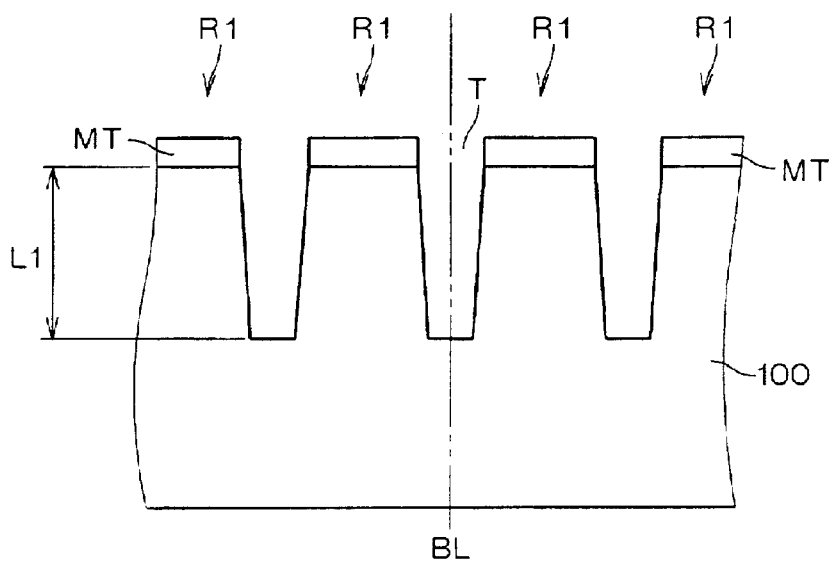

F I G . 3 9
< BACKGROUND ART >
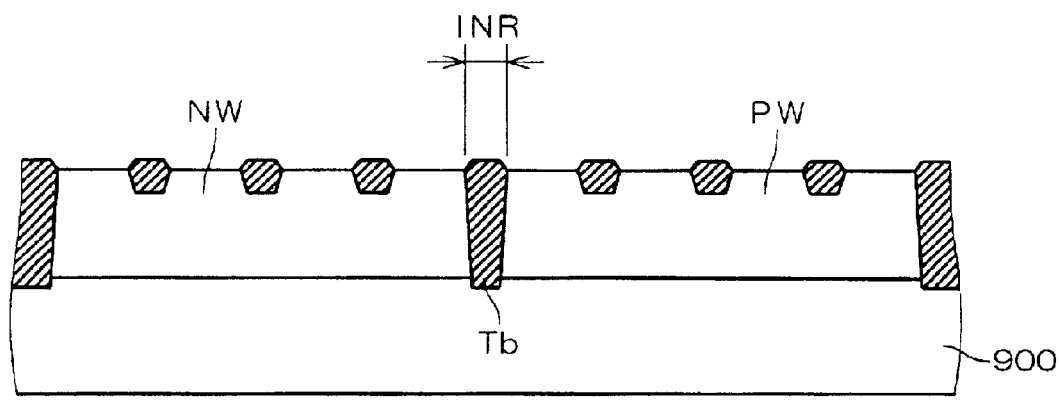
F I G . 4 0
< BACKGROUND ART >
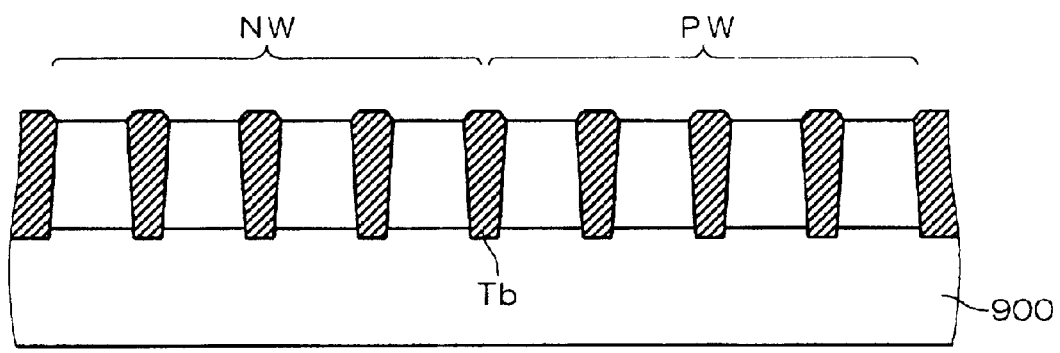

< BACKGROUND ART >

< BACKGROUND ART >

< BACKGROUND ART >

SEMICONDUCTOR DEVICE INCLUDING A WELL DIVIDED INTO A PLURALITY OF PARTS BY A TRENCH

BACKGROUND OF THE INVENTION

1. Field of the Invention

This invention relates to a semiconductor device in which a well is divided into a plurality of parts by a trench, and a method of manufacturing the semiconductor device.

2. Description of the Background Art

Semiconductor devices are usually formed by using a p-type semiconductor substrate (e.g., silicon substrate). As shown in FIG. 29, a p-channel transistor pT (source drain regions RN are of n-type) may be formed on a p-type semiconductor substrate 900, whereas in forming an n-channel transistor nT (source drain regions RP are of p-type), it is necessary to form a local n-type layer NW. The layer NW is called "well."

Wells are generally classified as thermal diffusion well and retro-grade well. In forming a thermal diffusion well NW, impurity N is implanted into a shallow position in a semiconductor substrate 900 (see FIG. 30), and the structure of FIG. 30 is subjected to heat treatment at high temperature for a prolonged time, so that the impurity N is diffused into the semiconductor substrate 900 (see FIG. 31), resulting in the thermal diffusion well NW. A retro-grade well MW is formed by implanting impurity N into a deep position in a semiconductor substrate 900, as shown in FIG. 32.

FIG. 33 shows the impurity concentration profile on the line A—A of FIG. 32. Since the retro-grade well is formed by implanting the impurity N, the impurity concentration profile can be set arbitrarily. In FIG. 33 it is controlled such that the impurity concentration has a maximum at a deep position P1 in the semiconductor substrate 900, and the impurity concentration at a shallow position P2 in the substrate 900 is higher than that of the substrate 900 and sufficiently lower than that of the channel. This offers the merit that the transistor nT in the well NW is protected against the influence of the potential outside of the well NW.

In recent years, the decreased size of a transistor nT has created the need for increasing the impurity concentration of the well NW in order to suppress punch through. In some elements, therefore, a well NW is intentionally distributed so as to reach the main surface of a semiconductor substrate 900 for adjustment of the impurity concentration of the well NW.

Adjustment of impurity concentration is required to not only an n-channel transistor nT but also a p-channel transistor pT in some cases. In this case, a p-type well PW is formed (see FIG. 34).

Further, if it is desired to arbitrarily set the substrate potential of the p-channel transistor pT (i.e., the potential of a back gate), the well PW is electrically isolated from other regions by an n-type bottom well BNW and a well NW, as shown in FIG. 35.

When a well NW and a well PW are in contact with each other (see FIG. 36), both wells can be electrically isolated by a depletion layer DR to be generated at the interface therebetween. This merit is to permit an easy electrical isolation between the well NW and the well PW. The depletion layer DR, however, has a tendency to extend and thus it might extend throughout a zone EUR. This causes the demerit that it is impossible to form a transistor in the zone EUR. An element isolation film Ta is formed in the zone EUR in which no transistor is formed (see FIG. 37).

To overcome the above demerit, a trench is formed at the boundary between the well NW and the well PW, and an element isolation film Tb is buried in the trench (see FIG. 38). Thereby, no depletion layer occurs at a well boundary between the well NW and the well PW (i.e., in the vicinity of the element isolation film Tb). This offers the merit that a transistor can be formed in the zone EUR by reducing the margin from the well boundary to a transistor. Unfortunately, the step of employing a trench is complicated and expensive which are the drawbacks of this step.

Two methods of well isolation using a trench are presently proposed. One comprises a first step of forming an element isolation film and a second step of forming n-type and p-type wells. FIG. 39 shows a structure formed by this method. With this method, no disadvantages are caused by reducing the margin from a well boundary to an element, however, the well isolation process using a trench involves the above two steps. Accordingly, this method is time-consuming and increases the manufacturing cost.

The other is to conduct the above first and second steps at the same time. FIG. 40 shows a structure formed by this method. The structure of FIG. 40 is realized by forming a deep element isolation film Th such as to correspond to the depth of wells NW and PW (see FIG. 41), or forming shallow wells NW and PW such as to correspond to the thickness of an element isolation film Th (see FIG. 42), alternatively, in a combination of these. In any event, the depth of the element isolation films Tb is evened and each of the wells NW and PW is divided into a plurality of parts by the element isolation film Tb.

It is, however, necessary to open a contact 201 per active region, namely, per well (see FIG. 43), in order to apply the desired potential to each of the isolated wells NW and PW. Thus it is necessary to increase the area of a well by the amount of a region CR for providing the contact 201. That is, as a whole, it fails to take full advantage of the merit in terms of area that is obtained by the trench as stated earlier with respect to FIG. 38. Also, there is a problem that layout area is increased by the amount of the region CR to be provided per well.

Accordingly, an object of the present invention is to provide a semiconductor device in which a well is divided into a plurality of parts by a trench, to effect a reduction in layout area, as well as a method of manufacturing the semiconductor device.

SUMMARY OF THE INVENTION

According to a first aspect of the present invention, a semiconductor device comprises: a semiconductor substrate; an element isolation film formed such as to have to a predetermined depth from a main surface of the semiconductor substrate, the element isolation film dividing the area from the main surface to the depth into a plurality of first regions; first wells formed in the first regions, respectively; and a second well formed in a second region deeper than the first wells in the semiconductor substrate, the second well being in contact with some of the first wells.

According to a second aspect, the semiconductor device according to the first aspect is characterized in that the first and second wells of the first and second regions on one side with reference to a predetermined boundary are of a first conductivity type, and the first and second wells on the other side are of a second conductivity type.

According to a third aspect, the semiconductor device according to the second aspect is characterized in that the second well of the first conductivity type and the second well of the second conductivity type are not in contact with each other.

According to a fourth aspect, the semiconductor device according to the first aspect is characterized in that the second well is formed on only one side of the second region with reference to a predetermined boundary.

According to a fifth aspect, the semiconductor device according to the fourth aspect is characterized in that the second well is formed in a memory cell part in the second region.

According to a sixth aspect, the semiconductor device according to the first aspect is characterized in that the second well is formed only in the vicinity of the bottom of the element isolation film in the second region.

According to a seventh aspect, the semiconductor device according to the first aspect is characterized in that each impurity concentration of the first and second wells is higher as being closer to a boundary part between the first and second regions.

According to an eighth aspect, the semiconductor device according to the first aspect further comprises a third well formed in a third region deeper than the second region in the semiconductor substrate.

According to a ninth aspect, a method of manufacturing a semiconductor device comprises the steps of: (a) forming an element isolation film such as to have a predetermined depth from a main surface of a semiconductor substrate, to divide the area from the main surface to the depth into a plurality of first regions; and (b) forming first wells in the first regions, respectively, and forming a second well making contact with some of the first wells, in a second region deeper than the first wells in the semiconductor substrate.

According to a tenth aspect, the method according to the ninth aspect is characterized in that the step (b) comprises the steps of (b-1) covering, with a first resist, one side region of the main surface with reference to a predetermined boundary in the semiconductor substrate; (b-2) implanting impurity of a first conductivity type into the first region by using the first resist as a mask; (b-3) implanting impurity of the first conductivity type into the second region by using the first resist as a mask; (b-4) removing the first resist; (b-5) covering, with a second resist, the other side region of the main surface with reference to the boundary in the semiconductor substrate; (b-6) implanting impurity of a second conductivity type into the first region by using the second resist as a mask; (b-7) implanting impurity of the second conductivity type into the second region by using the second resist as a mask; and (b-8) removing the second resist.

According to an eleventh aspect, the method according to the ninth aspect is characterized in that the step (b) comprises the steps of: (b-1) covering, with a first resist, one side region of the main surface with reference to a predetermined boundary in the semiconductor substrate; (b-2) implanting impurity of a first conductivity type into the first region by using the first resist as a mask; (b-3) reforming the first resist such as to be thicker, as a second resist; (b-4) implanting impurity of the first conductivity type into the second region by using the second resist as a mask; (b-5) removing the second resist; (b-6) covering, with a third resist, the other side region of the main surface with reference to the boundary in the semiconductor substrate; (b-7) implanting impurity of a second conductivity type into the first region by using the third resist as a mask; (b-8) reforming the third resist such as to be thicker, as a fourth resist; (b-9) implanting impurity of the second conductivity type into the second region by using the fourth resist as a mask; and (b-10) removing the fourth resist.

According to a twelfth aspect, a method of manufacturing a semiconductor device comprises the steps of: (a) forming a trench such as to have a predetermined depth from a main surface of a semiconductor substrate, to divide the area from the main surface to the depth into a plurality of regions in the semiconductor substrate; (b) implanting a first impurity from above the main surface into the trench; and (c) implanting a second impurity from above the main surface into the regions.

The first aspect enables that some of the first wells are electrically connected one another through the second well. It is therefore possible to apply a potential to all the first wells by placing a contact in at least one of the first wells. This leads to a reduction in layout area.

The second aspect allows the electrical connection between the first and second wells to be performed each conductivity type separately.

The third aspect has no chance that a depletion layer extends from the third region in the second region to the first well because the second well of the first conductivity type and the second well of the second conductivity type are not in contact with each other.

The fourth aspect enables to simplify the process and reduce the manufacturing cost, as compared with a semiconductor device of the second aspect.

The fifth aspect is extremely effective when applied to the memory cell part alone, in terms of simplification in process, manufacturing cost reduction and layout area reduction.

The sixth aspect enables to form the second well by utilizing a trench, for example.

The seventh aspect enables to prevent a depletion layer from extending to the first well even if the depletion layer occurs in the second well, by setting the impurity concentration of the first and second wells at the boundary between the first and second regions, to a sufficiently large value.

The eighth aspect allows the potential of the first and second wells to be set independently of the potential at a position lower than the third well.

The ninth aspect enables to manufacture a semiconductor device of the first aspect, and simplify the step of providing a contact and the step of providing wiring connected to the contact because the contact may be provided at least one of the first wells.

The tenth aspect enables to manufacture a semiconductor device of the second aspect, and simplify the manufacturing steps because a single resist is used in impurity implantation into both first and second regions.

The eleventh aspect enables to manufacture a semiconductor device of the third aspect, and easily obtain the structure in which the second well of the first conductivity type and the second well of the second conductivity type are not in contact with each other, by utilizing the feature that the taper of a resist becomes significant when the resist is thickened. In addition, even if impurity lift phenomenon occurs due to a marked taper of the second and fourth resists, the impurity related to the lift phenomenon is to be contained in the first well, thereby suppressing a noticeable change in impurity concentration profile.

The twelfth aspect enables to manufacture a semiconductor device of the sixth aspect, and form the second well by utilizing a trench.

These and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a cross-sectional view illustrating the structure of a semiconductor device according to a fifth preferred embodiment;

FIGS. 16 to 21 are cross-sectional views showing a sequence of steps in a method of manufacturing a semiconductor device according to a sixth preferred embodiment;

FIGS. 29 to 32 are cross-sectional views illustrating the structure of a conventional semiconductor device;

FIGS. 34 to 45 are cross-sectional views illustrating the structure of a conventional semiconductor device.

DESCRIPTION OF THE PREFERRED EMBODIMENTS

First Preferred Embodiment

Figure 1:
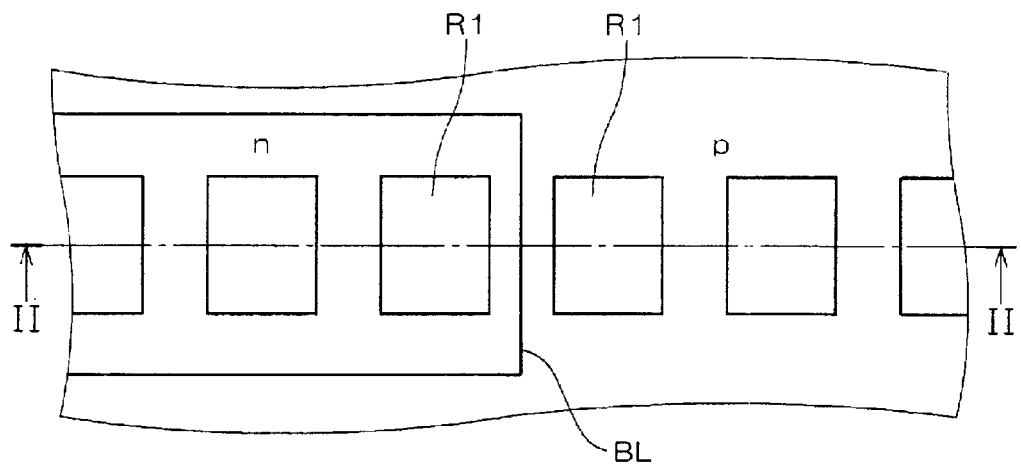
FIG. 1 is a plan view showing schematically the structure of a semiconductor device according to a first preferred embodiment of the present invention.
Figure 2:
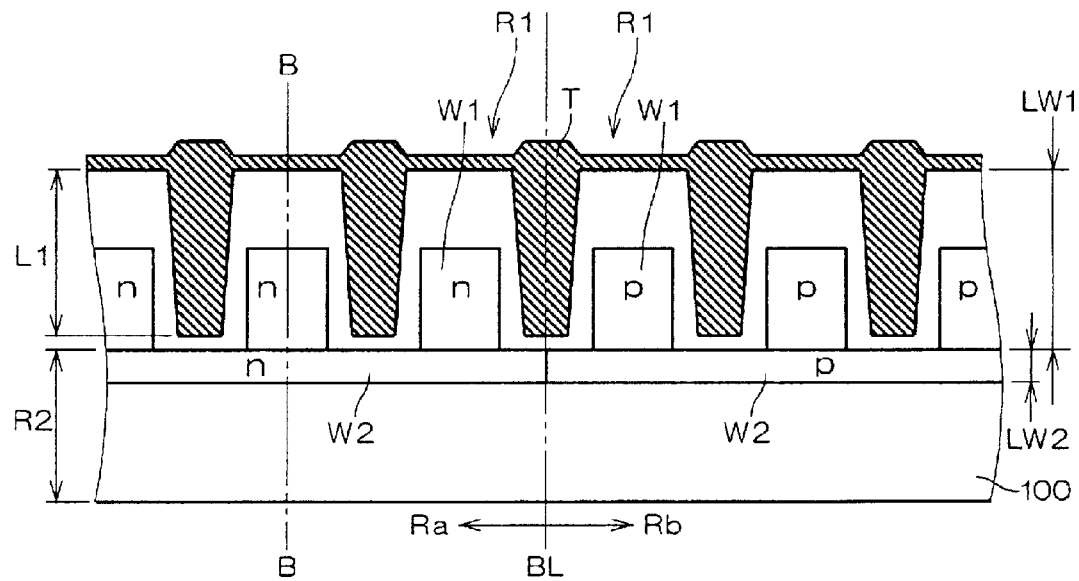
FIG. 2 is a cross-sectional view illustrating the structure of the semiconductor device of the first preferred embodiment.

FIG. 1 is a plan view showing schematically the structure of a semiconductor device according to a first preferred embodiment of the present invention. FIG. 2 is a cross-sectional view along the line II—II of FIG. 1.

Referring to FIGS. 1 and 2, an element isolation film T which is for example an insulating film of $SiO_2$ is formed such as to have depth L1 from the main surface of a p-type silicon semiconductor substrate 100. The element isolation film T divides the area from the main surface of the semiconductor substrate 100 to the depth L1 in the substrate 100 into a plurality of first regions R1. The depth L1 is from 1,000 angstrom to 10,000 angstrom.

A first well W1 is formed in each of the first regions R1. In the semiconductor substrate 100, a second well W2 is formed in a second region R2 deeper than the first well W1. The second well W2 is in contact with some of the first wells W1.

In accordance with the first preferred embodiment, distance LW1 from the main surface of the semiconductor substrate 100 to the bottom face of the first well W1 is longer than the depth L1 from the main surface of the semiconductor substrate 100 to the bottom face of the element isolation film T. The distance LW1 is for example 1.1 times the depth L1. Thickness LW2 of the second well W2 is smaller than the depth L1. The thickness LW2 is for example 0.9 times the depth L1.

In the second region R2 and the first regions R1, the first well W1 and the second well W2 on one side region Ra with reference to a predetermined boundary BL passing through the top and bottom of the element isolation film T are of n-type, and the first well W1 and the second well W2 on the other side region Rb are of p-type.

Figure 3:
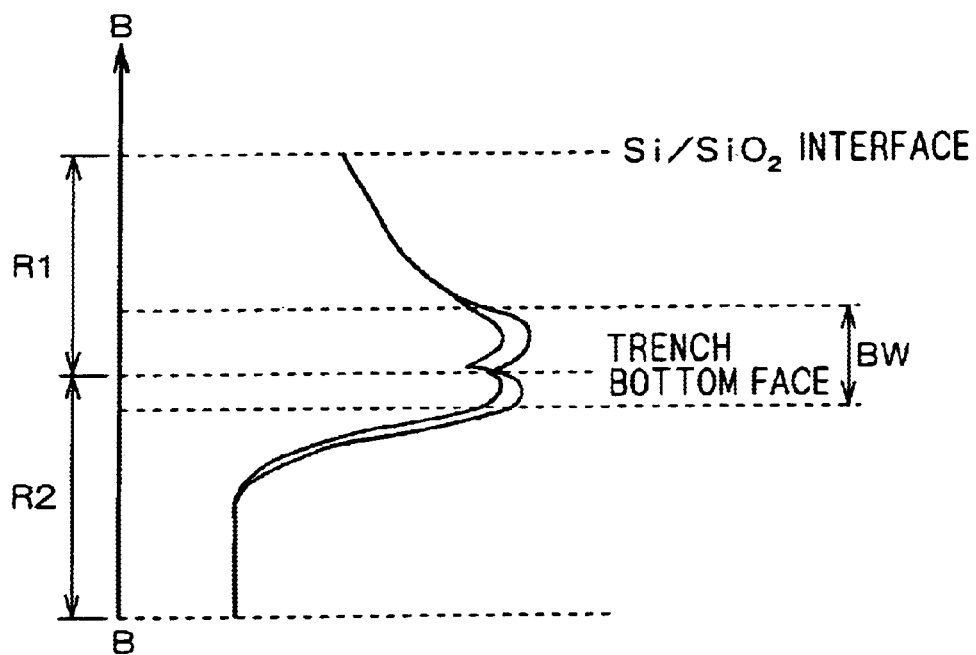
FIG. 3 is a graph showing the impurity concentration of the well in the semiconductor device of the first preferred embodiment.
Figure 4:
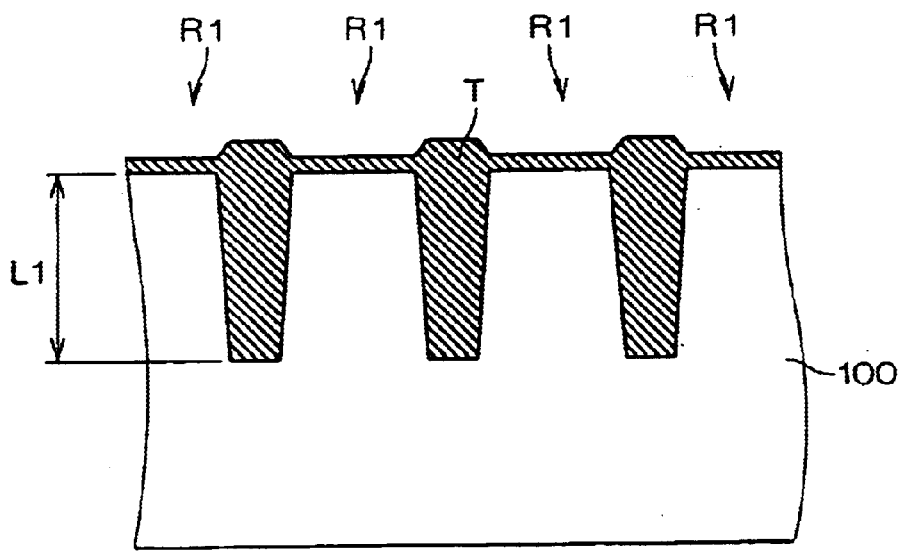
FIGS. 4 to 9 are cross-sectional views showing a sequence of steps in a method of manufacturing a semiconductor device according to a second preferred embodiment.
Figure 5:
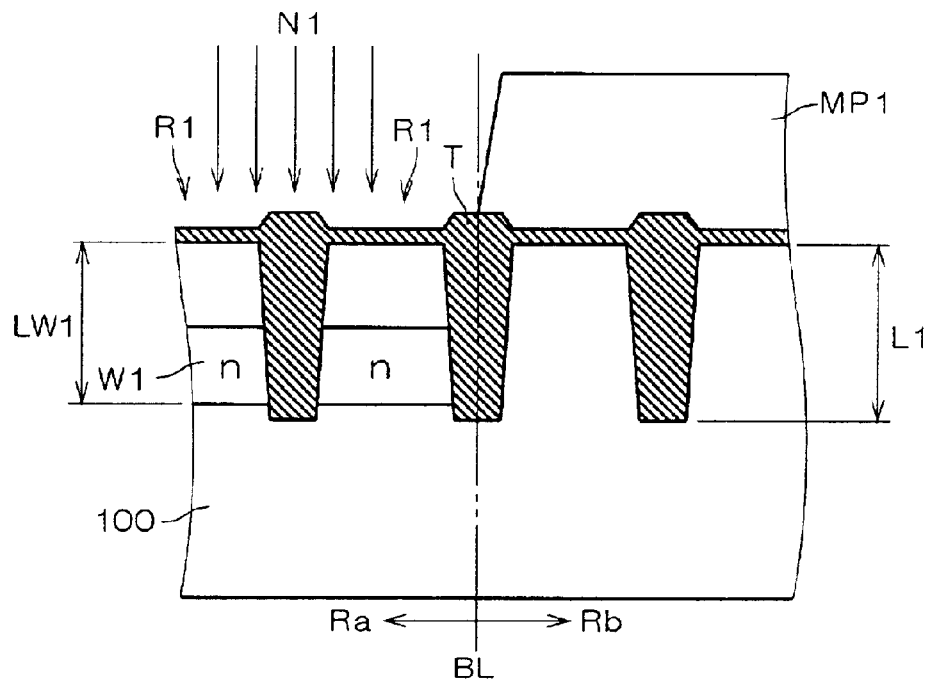

FIG. 3 shows the impurity concentration on the line B—B of FIG. 2. As shown in FIG. 3, both impurity concentration of the first well W1 and the second well W2 increase as they approach a boundary part BW between the first region R1 and the second region R2 (which part is located in the region consisting of the first and second regions R1 and R2, including the boundary between the regions R1 and R2). The impurity concentration of the first well W1 has a maximum in the vicinity of the bottom face of the element isolation film T (i.e., the trench bottom face), and its value is, for example, $1 \times 10^{18}/cm^3$. The impurity concentration of the second well W2 also has a maximum in the vicinity of the trench bottom face, and its value is, for example, $5 \times 10^{18}/cm^3$.

A single element (e.g., an MOS transistor) is formed in a single first region R1. When an MOS transistor is formed in the first region R1, the first well W1 functions to determine the impurity concentration between source and drain.

Figure 36:
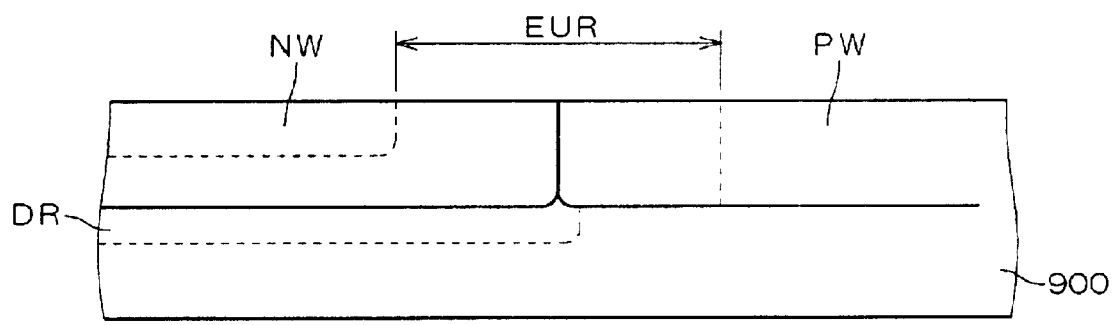
Figure 37:
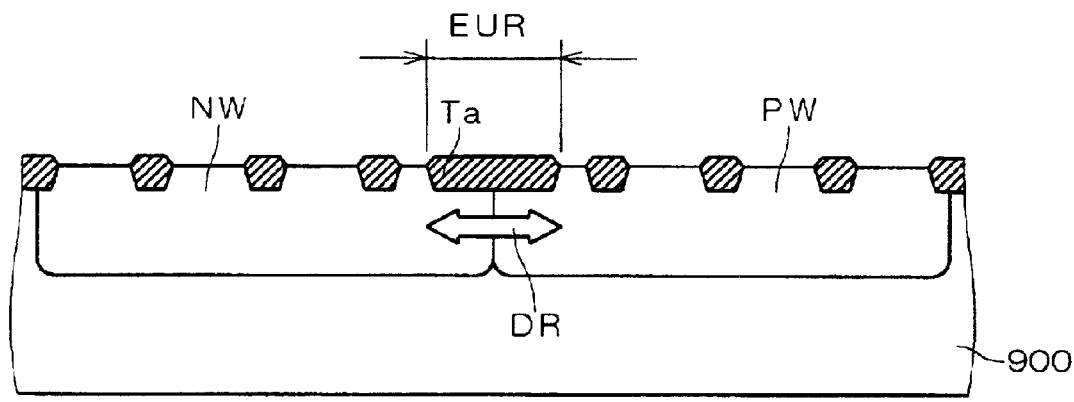
Figure 38:
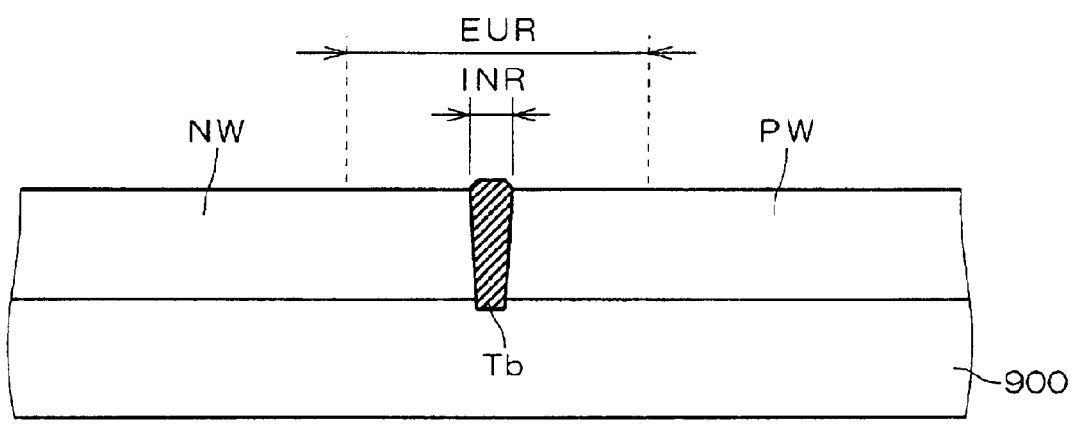
Figure 41:
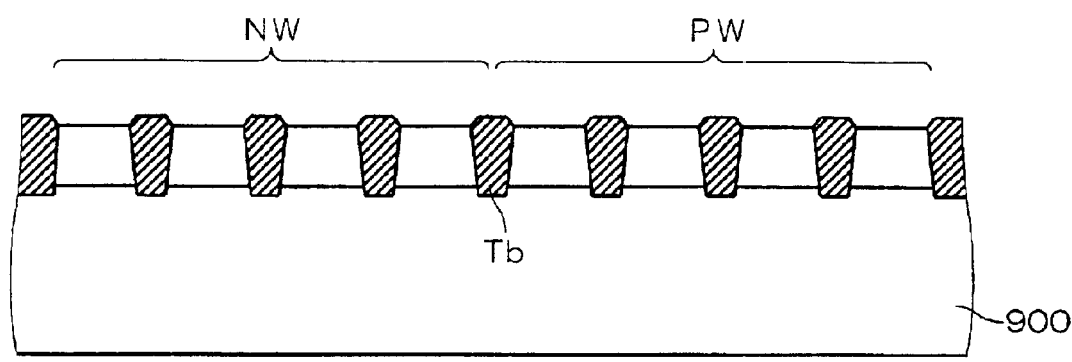
Figure 42:
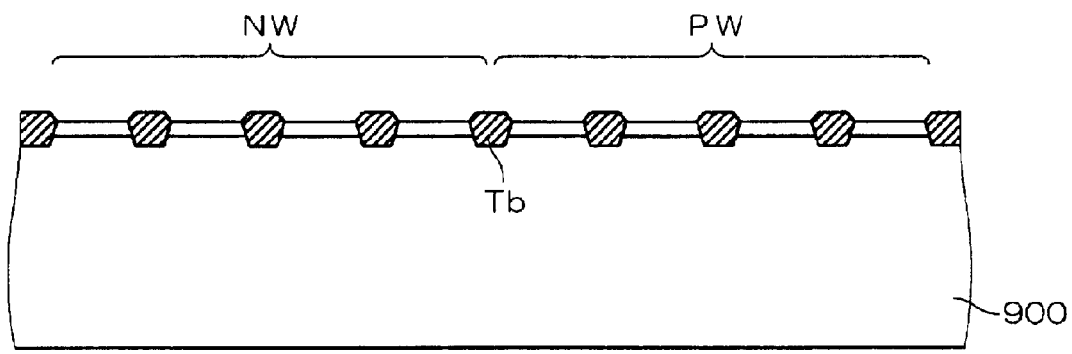

A comparison of the first preferred embodiment with prior art is made as below. In the structure of FIG. 36, the impurity concentration of the n-type well NW and the p-type well PW is set appropriately such that the depletion layer DR extends suitably, thereby isolating the n-type first well W1 and the p-type first well W1 with each other. Whereas in the structure of FIG. 2, the n-type first well W1 and the p-type first well W1 can be isolated by the element isolation film T provided therebetween, instead of a depletion layer. Therefore, the impurity concentration of the n-type first well W1 and the p-type first well W1 can be set more optionally than that in the structure of FIG. 36.

Further, the structure of FIG. 2 is free from such a well boundary as in the structure of FIG. 36, and no depletion layer is present in the vicinity of a region 3 in FIG. 2, thus causing no disadvantages in reducing the margin from the region R3 to the MOS transistor.

Since in the structure of FIG. 2, the n-type second well W2 and the p-type second well W2 are in contact with each other at the boundary BL in the second region R2, a depletion layer extends from such an interface. By this depletion layer, the n-type second well W2 and the p-type second well W2 are isolated with each other. It is possible to prevent the depletion layer from extending from the interface between the n-type second well W2 and the p-type second well W2 to the first well W1, by setting such that the impurity concentration of the first and second wells W1 and W2 is sufficiently high in the vicinity of the trench bottom face of the element isolation film T (see FIG. 3).

Figure 43:
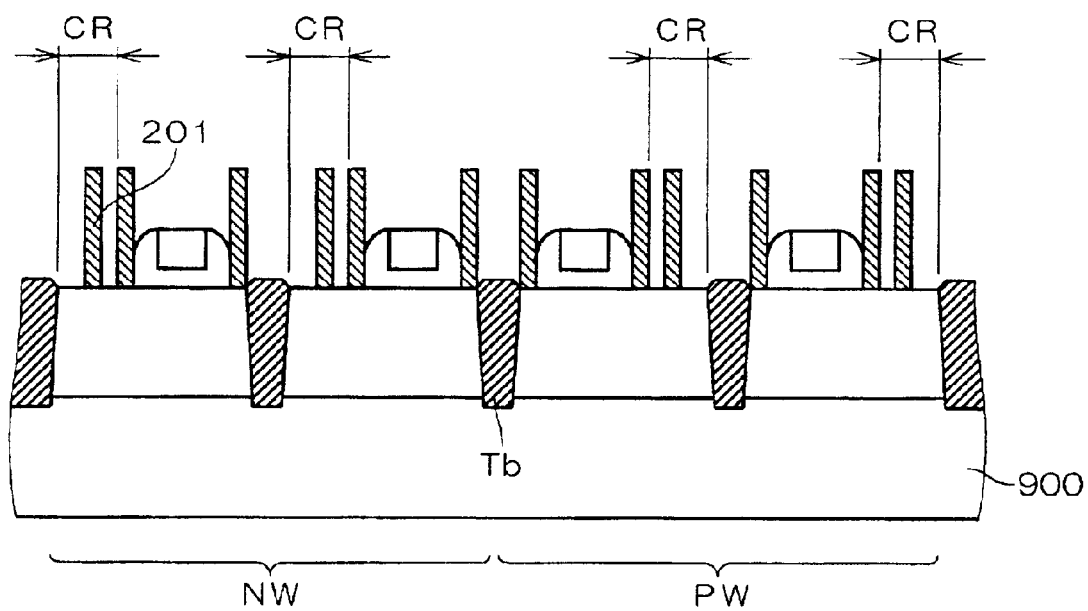

The structure of FIG. 43 requires a region CR for making contact with the first well W1 per the first well W1, in order to apply a potential to all the first wells W1. Whereas in the structure of FIG. 2, the second well W2 makes contact with some of the first wells W1 to establish electrical contact therewith. It is therefore possible to apply a potential to all the first wells W1 by placing a contact in at least one of the first wells W1. It is also possible to reduce layout area by the amount of the reduced contacts 201.

In addition, the electrical connection between the first well W1 and the second well W2 can be performed per n-type and p-type individually.

Second Preferred Embodiment

A method of manufacturing a semiconductor device with the structure as stated in the first preferred embodiment will be described by referring to FIGS. 4 to 9.

Firstly, a trench is formed at depth L1 (i.e., 1,000–10,000 angstrom) from the main surface of a p-type semiconductor substrate by for example etching, and an element isolation film T is formed in the trench. By the element isolation film T, the area from the main surface of the semiconductor substrate 100 to the depth L1 in the substrate 100 is divided into a plurality of first regions R1 (see FIG. 4).

Region Rb in the main surface of the semiconductor substrate 100 is covered with a resist MP1. By using the resist MP1 as a mask, an n-type impurity N1 is implanted from above a region Ra in the main surface of the semiconductor substrate 100 to the first regions R1, thereby forming an n-type first well W1 in the first region R1 (see FIG. 5).

For example, boron is used as the impurity N1, and its dose is $1 \times 10^{13}/cm^2$. Distance LW1 from the main surface of the semiconductor substrate 100 to the bottom face of the first well W1 may be smaller than the depth L1 from the main surface of the substrate 100 to the bottom face of the element isolation film T, and the distance LW1 is 0.9 times the depth L1, for example.

Figure 6:
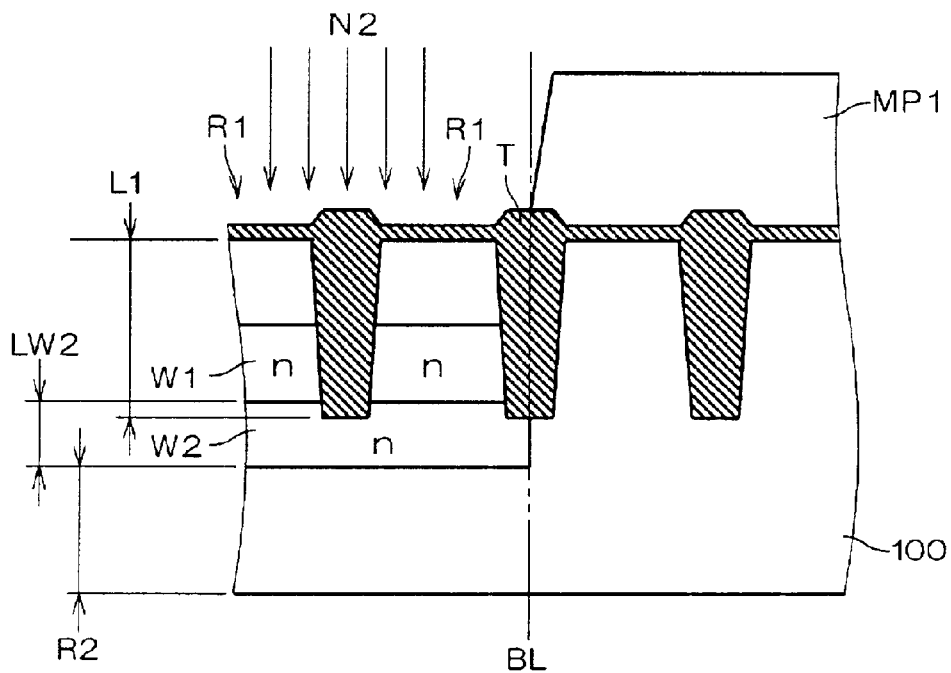
Figure 7:
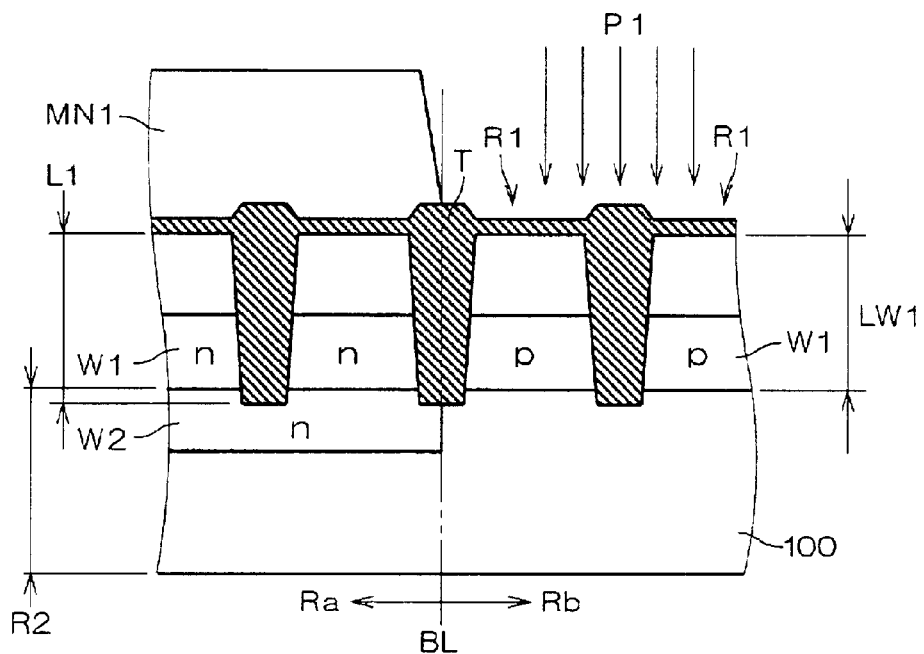

Then, by using the resist MP1 as a mask, an n-type impurity N2 is implanted from above the region Ra of the semiconductor substrate 100 to the second region R2, thereby forming an n-type second well W2 in the second region R2 (see FIG. 6).

For example, boron is used as the impurity N2, and its dose is $1 \times 10^{13}/cm^2$. Thickness LW2 of the second well W2 may be longer than the depth L1, and it is 1.1 times the depth L1, for example.

After the resist MP1 is removed, the region Ra in the main surface of the semiconductor substrate 100 is covered with a resist MN1. By using the resist MN1 as a mask, a p-type impurity P1 is implanted from above the region Rb in the main surface of the substrate 100 to the first region R1, thereby forming a p-type first well W1 in the first region R1 (see FIG. 7).

For example, phosphorus is used as the impurity P1, and its dose is $1 \times 10^{13}/cm^2$. Distance LW1 from the main surface of the semiconductor substrate 100 to the bottom face of the first well W1 may be smaller than the depth L1 from the main surface of the substrate 100 to the bottom face of the element isolation film T, and the distance LW1 is 0.9 times the depth L1, for example.

Figure 8:
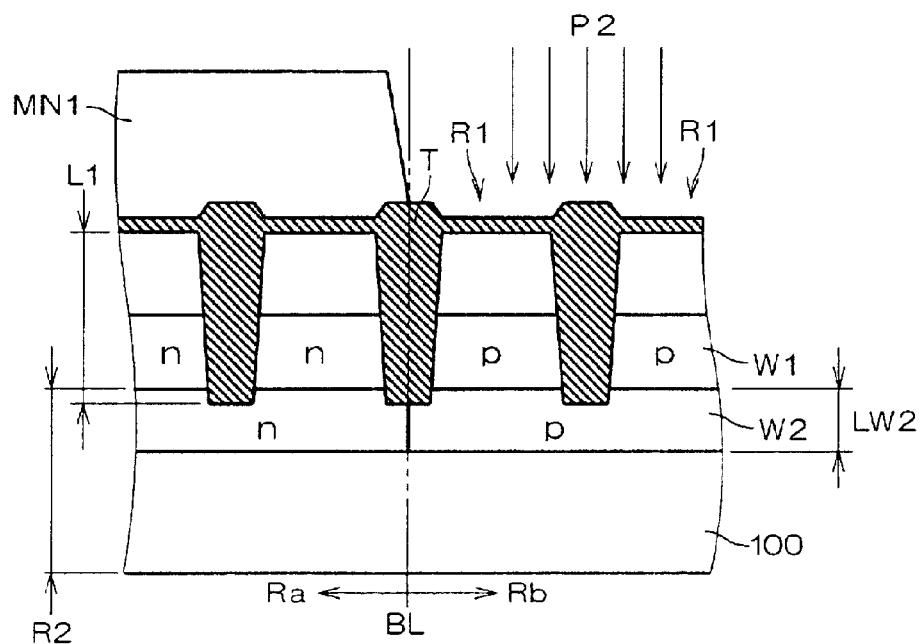

Then, by using the resist MN1 as a mask, a p-type impurity P2 is implanted from above the region Rb of the semiconductor substrate 100 to the second region R2, thereby forming a p-type second well W2 in the second region R2 (see FIG. 8).

For example, phosphorus is used as the impurity P2, and its dose is $1 \times 10^{13}/cm^2$. Thickness LW2 of the second well W2 may be larger than the depth L1 and it is for example 1.1 times the depth L1.

Figure 9:
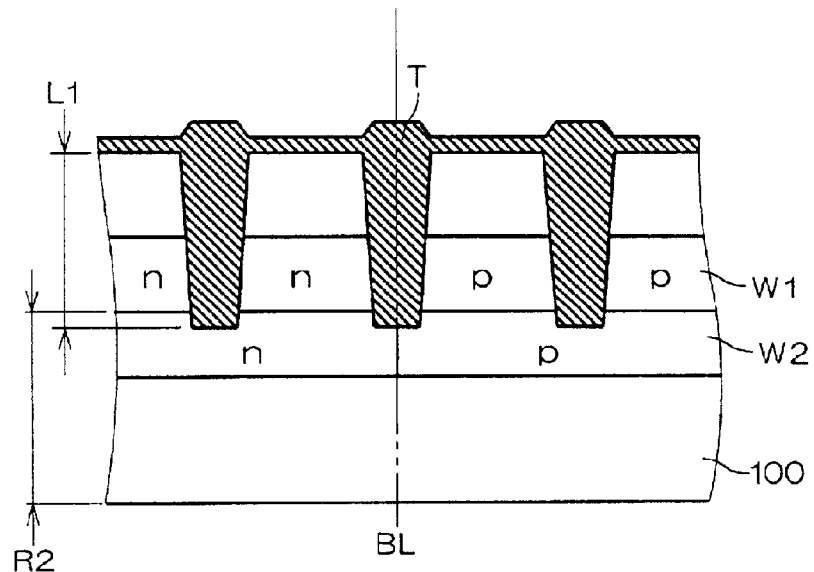

The resist MN1 is then removed to obtain the structure as described in the first preferred embodiment (see FIG. 9). Thus, the first well W1 is formed per first region R1, and the second well W2 having contact with some of the first wells W1 is formed in the second region R2 deeper than the first well W1 in the semiconductor substrate 100 (see FIGS. 5 to 9).

Thereafter, a gate oxide film (not shown) having for example a thickness of 50 angstrom is formed and an element such as a transistor (not shown) is formed in the first region R1 by for example channel doping. This is followed by predetermined various processes (e.g., assembler process), resulting in a semiconductor device.

As stated in the first preferred embodiment, since a contact is provided at least one of the first wells W1, it is possible to simplify the step of providing contacts and the step of providing wiring connected to the contacts.

In addition, the resist MP1 is used in implanting both impurities N1 and N2, and the resist MN1 is used in implanting both impurities P1 and P2, thus simplifying the manufacturing steps.

Third Preferred Embodiment

Figure 10:
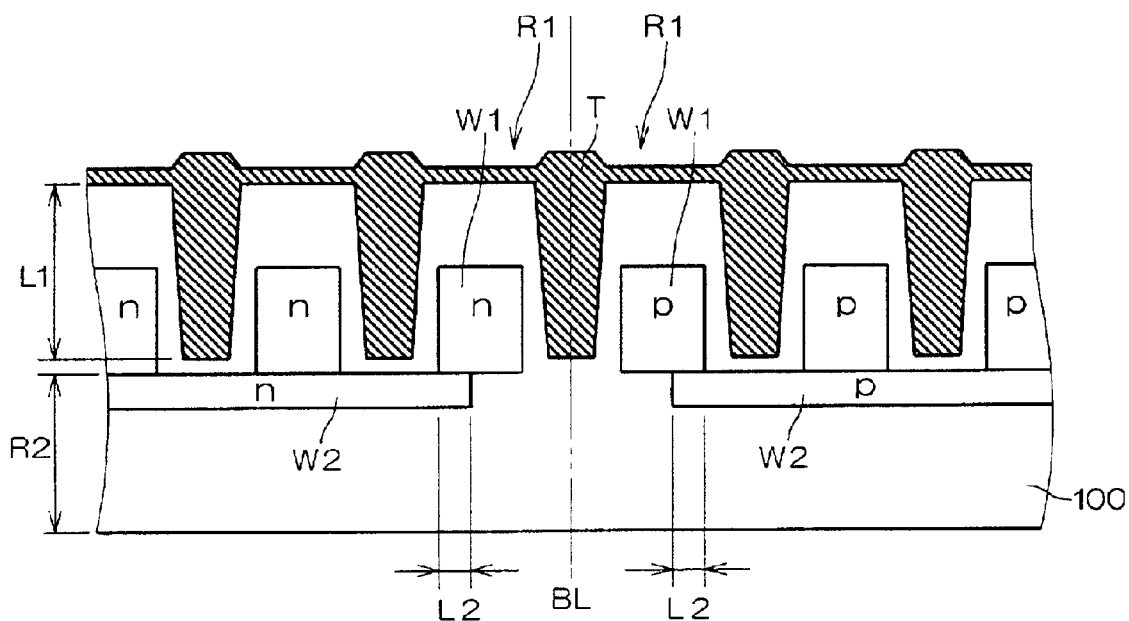
FIG. 10 is a cross-sectional view illustrating the structure of a semiconductor device according to a third preferred embodiment.
Figure 11:
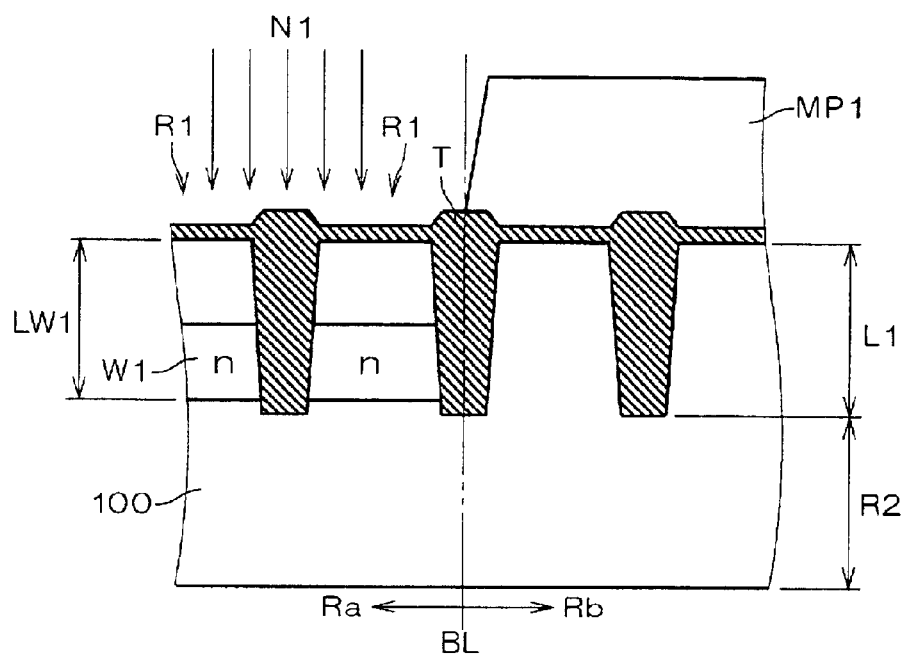
FIGS. 11 to 14 are cross-sectional views illustrating a sequence of steps in a method of manufacturing a semiconductor device according to a fourth preferred embodiment.

FIG. 10 is a cross-sectional view illustrating the structure of a semiconductor device according to a third preferred embodiment. This embodiment is a modification of the first preferred embodiment. In the first preferred embodiment the n-type second well W2 and the p-type second well W2 are in contact with each other at the boundary BL, as shown in FIG. 2. On the other hand, in the third preferred embodiment the n-type and p-type second wells W2 are not in contact with each other at a boundary BL, as shown in FIG. 10.

A first well W1 and a second well W2 on the sides of an element isolation film T at the boundary BL are in contact with each other. For example, a 1 μm contact length L2 between the first and second wells W1 and W2 is sufficient.

Since in the structure of FIG. 10, the n-type second well W2 and the p-type second well W2 are not in contact with each other, there is no possibility that a depletion layer extends from the boundary BL in the second region R2 to the first well W1.

Fourth Preferred Embodiment

A method of manufacturing a semiconductor device with the structure as described in the third preferred embodiment will be described by referring to FIGS. 4 and 11 to 14.

Firstly, a trench is formed at depth L1 (i.e., 1,000–10,000 angstrom) from the main surface of a p-type semiconductor substrate by for example etching, and an element isolation film T is formed in the trench. By the element isolation film T, the area from the main surface of the semiconductor substrate 100 to the depth L1 in the substrate 100 is divided into a plurality of first regions R1 (see FIG. 4).

Region Rb in the main surface of the semiconductor substrate 100 is covered with a resist MP1. By using the resist MP1 as a mask, an n-type impurity N1 is implanted from above a region Ra in the main surface of the semiconductor substrate 100 to the first regions R1, thereby forming an n-type first well W1 in the first region R1 (see FIG. 11).

For example, boron is used as the impurity N1, and its dose is $1 \times 10^{13}/cm^2$. Distance LW1 is 0.9 times the depth L1, for example.

Figure 12:
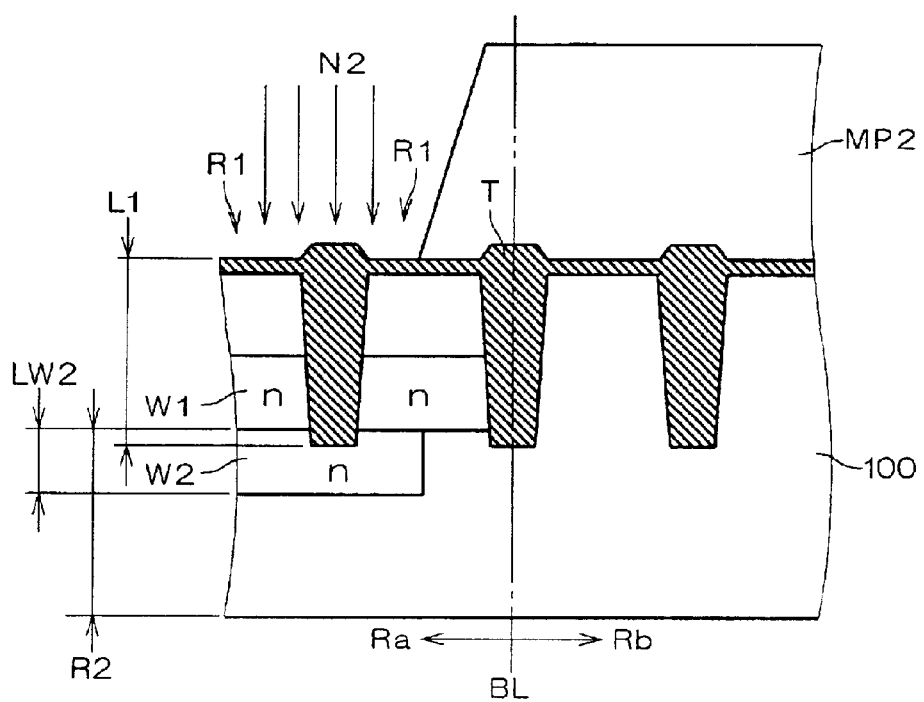
Figure 13:
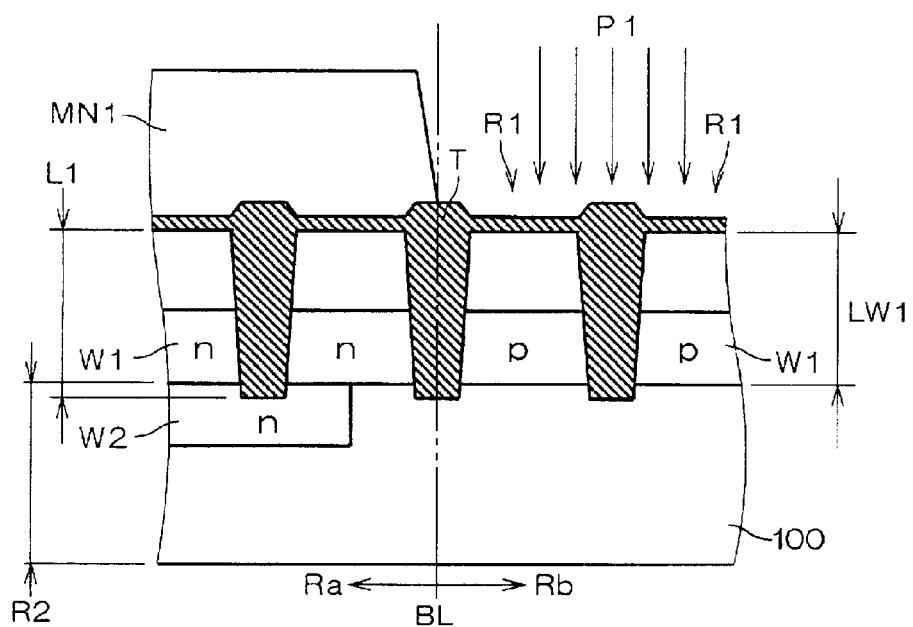

Then, the resist MP1 is reformed such as to be thicker, as a resist MP2 (see FIG. 12). Specifically, for example, the resist MP1 is removed and the region Rb in the semiconductor substrate 100 is covered with a resist MP2 in the same conditions as stated earlier. Here, it is set such that the resist MP2 is thicker than the resist MP1. Alternatively, the resist MP1 may be left and then reformed as a resist MP2 having a greater thickness by stacking a resist on the resist MP1.

This is because that the resist MP2 is required to have a greater thickness in order to prevent the impurity N2 from passing through the resist MP2 and being implanted into an undesirable region since the impurity N2 implanted later is implanted at an energy higher than that in the impurity N1. As shown in FIG. 12, taper is more noticeable as the resist MP2 becomes thicker, and the taper part of the resist MP2 extends to the region Ra beyond the boundary BL.

Then, by using the resist MP2 as a mask, an n-type impurity N2 is implanted from above the region Ra of the semiconductor substrate 100 to the second region R2, thereby forming an n-type second well W2 in the second region R2.

For example, boron is used as the impurity N2, and its dose is $1 \times 10^{13}/cm^2$. Thickness LW2 is 1.1 times the depth L1, for example.

After the resist MP2 is removed, the region Ra in the main surface of the semiconductor substrate 100 is covered with a resist MN1. By using the resist MN1 as a mask, a p-type impurity P1 is implanted from above the region Rb of the main surface in the substrate 100 to the first region R1, thereby forming a p-type first well W1 in the first region R1 (see FIG. 13).

For example, phosphorus is used as the impurity P1, and its dose is $1 \times 10^{13}/cm^2$. Distance LW1 is 0.9 times the depth L1, for example.

Figure 14:
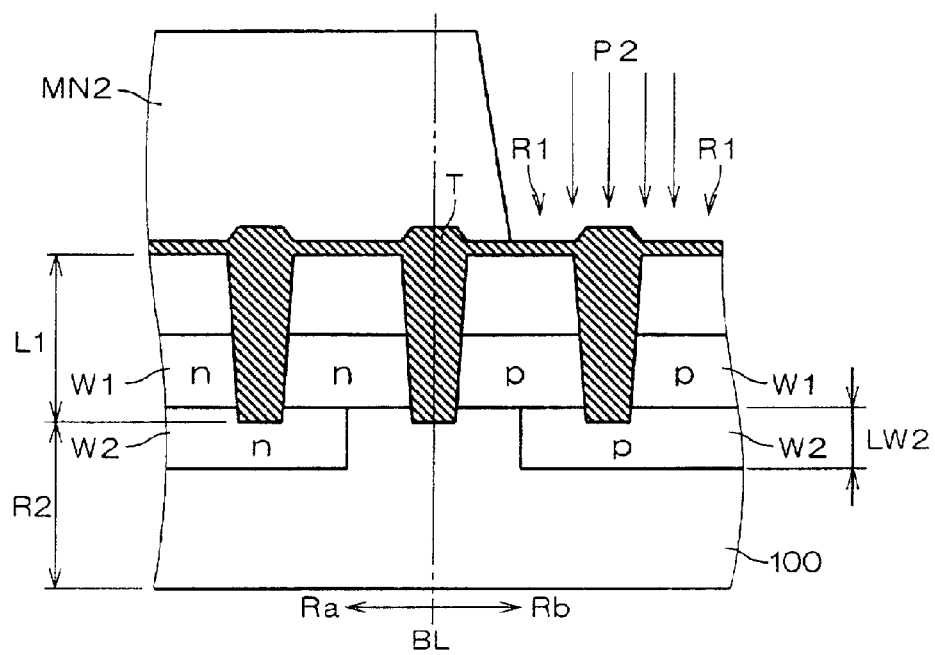

Then, the resist MN1 is reformed such as to be thicker, as a resist MP2 (see FIG. 14). Specifically, for example, the resist MN1 is removed and the region Ra in the semiconductor substrate 100 is covered with a resist MN2 in the same conditions as stated earlier. Here, it is set such that the resist MN2 is thicker than the resist MN1. Alternatively, the resist MN1 may be left and then reformed as a resist MN2 having a great thickness by stacking a resist on the resist MN1.

This is because that the resist MN2 is required to have a great thickness in order to prevent the impurity P2 from passing through the resist MN2 and being implanted into an undesirable region since the impurity P2 implanted later is implanted at an energy higher than that in the impurity P1. As the resist MN2 becomes thicker, taper is more noticeable and, as shown in FIG. 14, the taper part of the resist MN2 extends to the region Rb beyond the boundary BL.

Then, by using the resist MN2 as a mask, a p-type impurity P2 is implanted from above the region Rb in the main surface of the semiconductor substrate 100 to the second region R2, thereby forming a p-type second well W2 in the second region R2.

For example, phosphorus is used as the impurity P2, and its dose is $1 \times 10^{13}/cm^2$. Thickness LW2 is 1.1 times the depth L1, for example.

The resist MN2 is then removed to obtain the structure as described in the third preferred embodiment. Thus, the first well W1 is formed in each of the first regions R1, and the second well W2 having contact with some of the first wells W1 is formed in the second region R2 deeper than the first wells W1 in the semiconductor substrate 100 (see FIGS. 11 to 14).

Thereafter, a gate oxide film (not shown) with a thickness of 50 angstrom, for example, an element such as a transistor (not shown) is formed in the first region R1 by channel doping, for example. This is followed by predetermined various processes (e.g., assembler process), resulting in a semiconductor device.

Effects of the fourth preferred embodiment will be described. The structure in which the n-type second well W2 and the p-type second well W2 are not in contact with each other is obtained easily by utilizing the feature that the taper of the resists MP2 and MN2 becomes significant when the resists MP2 and MN2 is thickened.

Figure 44:
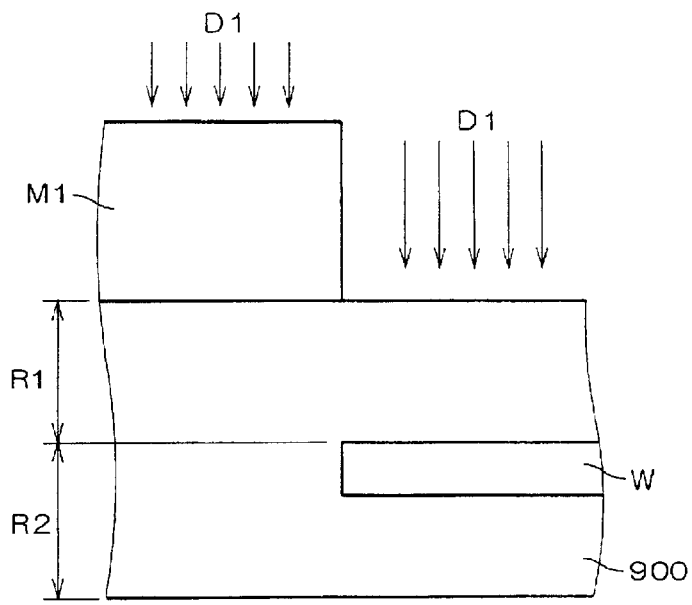
Figure 45:
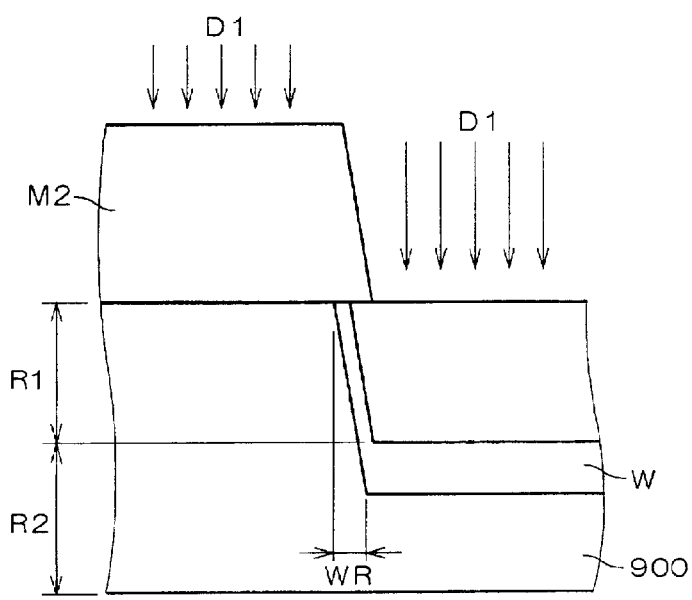

It is, however, known that the following drawbacks occur when taper becomes significant. A comparison is made between the case where a well W is formed by implanting an impurity D1 into a second region R2 in a semiconductor substrate 900 by using, as a mask, a resist M1 whose taper is insignificant (see FIG. 44), and the case where a well W is formed by implanting an impurity D1 into a second region R2 in a semiconductor substrate 900 by using, as a mask, a resist M2 whose taper is significant (see FIG. 45). In the structure of FIG. 45, the impurity D1 passes through the taper of the resist M2, so that the impurity D1 is implanted into a region WR immediately beneath the taper, from a deep position to a shallow position in the semiconductor substrate 900 (this is called as lift phenomenon). On the other hand, such impurity lift phenomenon does not occur in the structure of FIG. 44. The impurity lift phenomenon may change the impurity concentration profile. In particular, the difference in polarity between the semiconductor substrate 900 and the impurity D1 would cause a great difference in electrical properties.

As shown in FIGS. 12 and 14, the first well W1 is already formed in the first region before the impurities N2 and P2 are implanted into the second region R2 of the semiconductor substrate 100. Therefore, even if the impurity lift phenomenon occurs, the impurity related to the lift phenomenon is to be contained in the first well W1, thereby making it possible to suppress a marked change in the impurity concentration profile.

Fifth Preferred Embodiment

FIG. 15 is a cross-sectional view illustrating the structure of a semiconductor device according to a fifth preferred embodiment. This embodiment is a modification of the third preferred embodiment. As shown in FIG. 10, in the third preferred embodiment the second well W2 is formed throughout the region beneath the first regions R1 (except for the first regions R1 on both sides of the boundary BL). Whereas in the fifth preferred embodiment the second well W2 is formed only in the vicinity of the bottom of a second region R2 of an element isolation film T, along the bottom of the second region R2 of the film T, as shown in FIG. 15. With this structure, the second well W2 makes contact with some of the first wells W1, thus establishing electrical contact therewith.

Sixth Preferred Embodiment

A method of manufacturing a semiconductor device with the structure as stated in the fifth preferred embodiment will be described by referring to FIGS. 16 to 21.

Firstly, in a flat main surface of a p-type semiconductor substrate 100 prior to forming a trench (groove), the area except for a region whereat a trench will be formed is covered with a resist MT. By using the resist MT as a mask, the semiconductor substrate 100 is subjected to etching for forming a trench T1 (groove) with depth L1 (1,000–100,000 angstrom) from the main surface of the substrate 100. By the trench T1, the area from the main surface of the semiconductor substrate 100 to the depth L1 in the substrate 100 is divided into a plurality of first regions R1 (see FIG. 16).

Then, the trench T1 at a boundary BL and a region Rb in the main surface of the semiconductor substrate 100 are covered with a resist MP2. By using the resist MP2 and the resist MT as masks, an n-type impurity N2 is implanted from above the region Ra of the main surface in the substrate 100 to the trench T1. This enables to form an n-type well W2 on the inner walls of the trench T1 and beneath the element isolation film T of the second region R2 (see FIG. 17).

For example, boron is used as the impurity N2, and its dose is $1\times10^{13}/cm^2$. Thickness LW2 is 0.1 times the depth L1, for example.

After the resist MP2 is removed (the resist MT is left), the trench T1 at the boundary BL and the region Ra of the main surface in the semiconductor substrate 100 are covered with a resist MN2. By using the resist MN2 and the resist MT as masks, a p-type impurity P2 is implanted from above the region Rb of the main surface in the substrate 100 to the trench T1. Thereby, a p-type second well W2 is formed on the inner walls of the trench T1 and beneath the element isolation film T (see FIG. 18).

For example, phosphorus is used as the impurity P2, and its dopand dose is $1\times10^{13}/cm$. Distance LW2 is 0.1 times the depth L1, for example.

Figure 19:
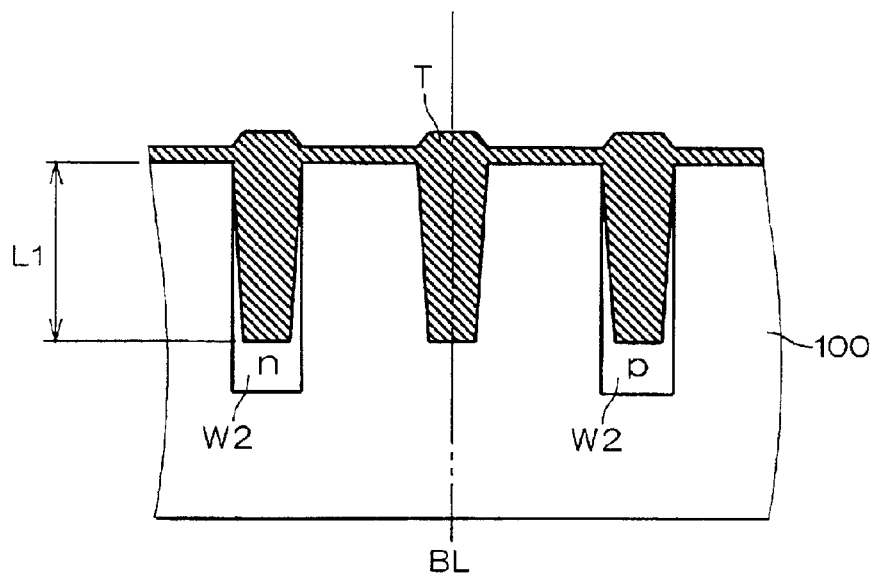
Figure 20:
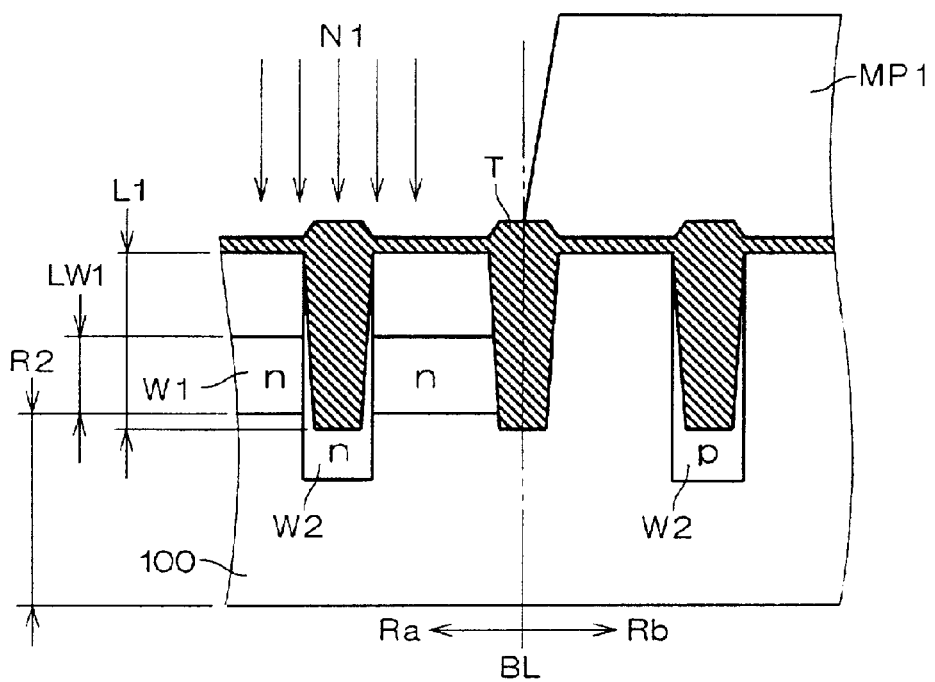
Figure 21:
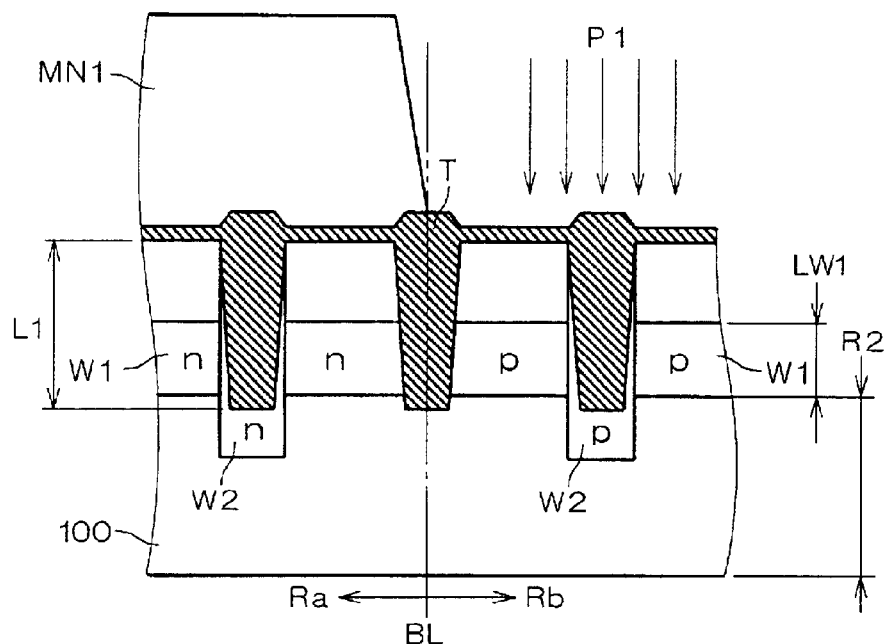

After the resist MN2 and the resist MT are removed, an element isolation film T is formed in the trench T1 (see FIG. 19). If necessary, the element isolation film T is flattened.

The region Rb in the main surface of the semiconductor substrate 100 is covered with a resist MP1. Then, by using the resist MP1 as a mask, an n-type impurity N1 is implanted from above the region Ra of the main surface in the semiconductor substrate 100 to the first region RI, thereby forming an n-type first well W1 in the first region R1 (see FIG. 20).

For example, boron is used as the impurity Ni, and its dopand dose is $1\times10^{13}/cm$. Distance LW1 is 0.9 times the depth L1, for example.

After the resist MP1 is removed, the region Ra in the main surface of the semiconductor substrate 100 is covered with a resist MN1. By using the resist MN1 as a mask, a p-type impurity P1 is implanted from above the region Rb of the main surface in the substrate 100 to the first region R1, thereby forming a p-type first well W1 in the first region R1 (see FIG. 21).

For example, phosphorus is used as the impurity P1, and its dopand dose is $1\times10^{13}/cm$. Distance LW1 is 0.9 times the depth L1, for example.

The resist MN1 is then removed to obtain the structure as described in the fifth preferred embodiment.

Thereafter, a gate oxide film (not shown) with a thickness of 50 angstrom, for example, is formed and an element such as a transistor (not shown) is formed in the first region R1 by channel doping, for example. This is followed by predetermined various processes (e.g., assembler process), resulting in a semiconductor device.

As described above, the second well W2 can be formed by utilizing the trench T1 and the resist MT used in forming the trench T1.

Seventh Preferred Embodiment

Figure 22:
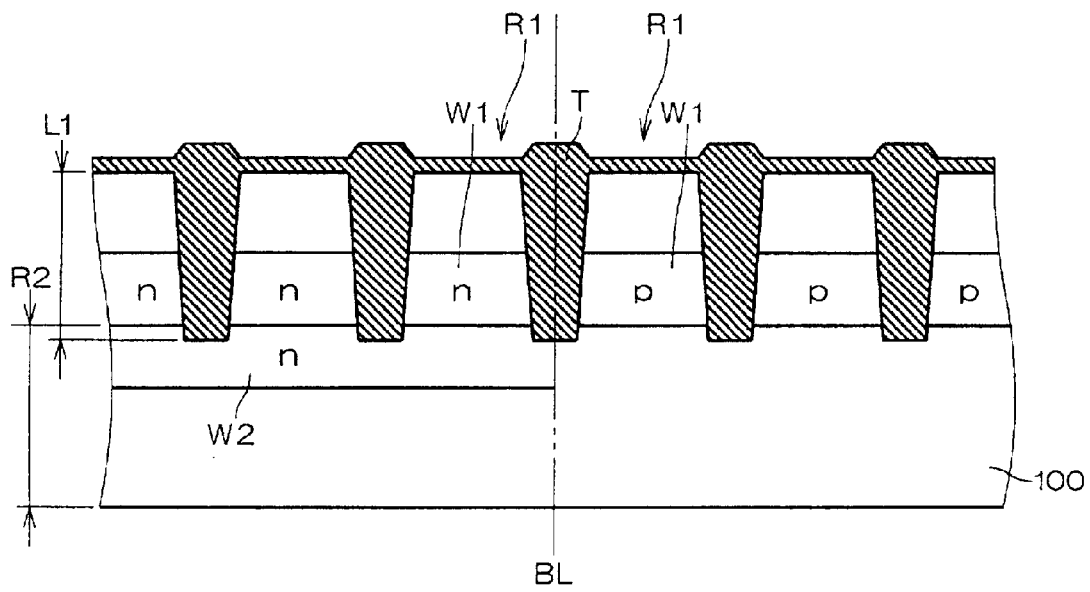
FIG. 22 is a cross-sectional view illustrating the structure of a semiconductor device according to a seventh preferred embodiment.

FIG. 22 is a cross-sectional view illustrating the structure of a semiconductor device according to a seventh preferred embodiment. This embodiment is a modification of the first to sixth preferred embodiments. In the first to sixth preferred embodiments, the n-type second well W2 and the p-type second well W2 are both formed. Whereas in the seventh preferred embodiment, for a p-type semiconductor substrate 100, a p-type second well W2 is omitted and only an n-type second well W2 is formed. For an n-type semiconductor substrate 100, an n-type second well W2 is omitted and only a p-type second well W2 is formed.

FIG. 22 shows the case where a p-type second well W2 is eliminated from the structure of FIG. 9.

Thus, the second well W2 is formed on only one side of the second region R2 with reference to the boundary BL.

Figure 18:
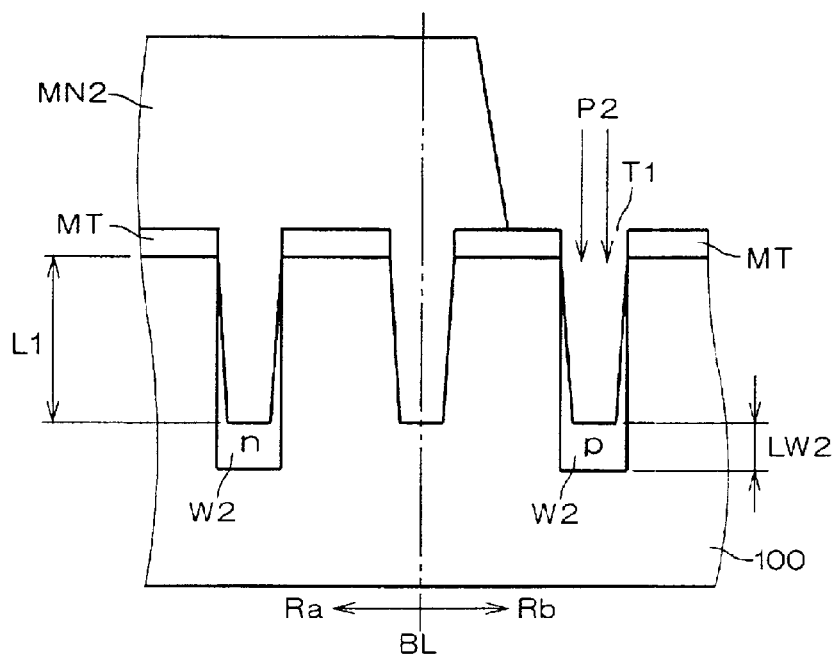

It is possible to simplify the process and reduce the manufacturing cost by the omission of either the p-type second well W2 or the n-type second well W2. For instance, the step of implanting the impurity P2 as shown in FIG. 8 can be omitted in the second preferred embodiment, and the step of forming the resist MN2 and the step of implanting the impurity P2 as shown in FIGS. 14 and 18 can be omitted in the fourth and sixth preferred embodiments, respectively.

Eighth Preferred Embodiment

Figure 23:
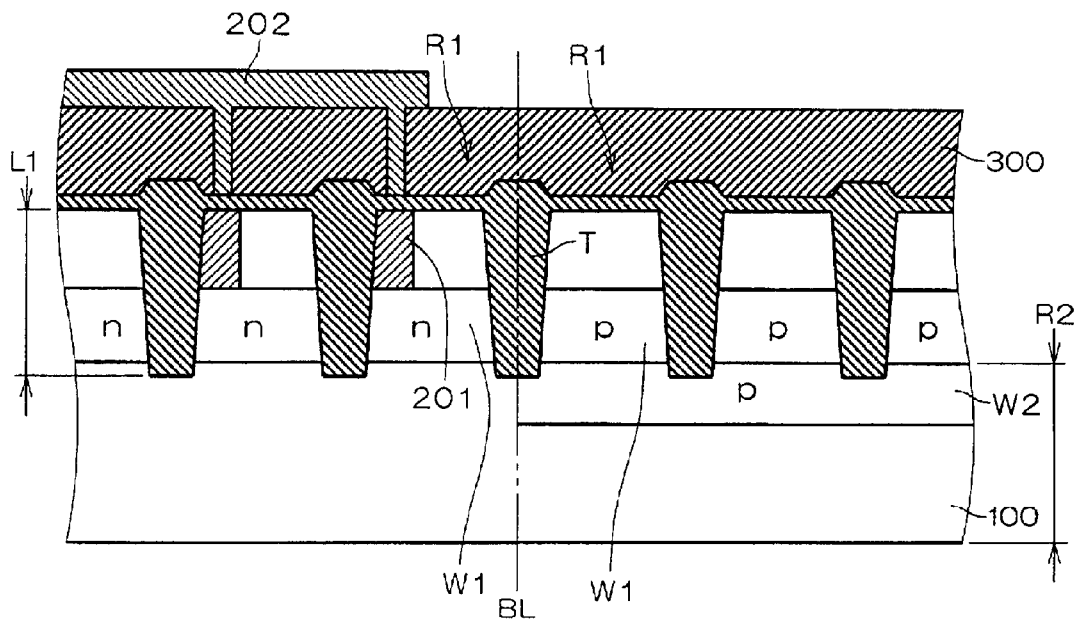
FIG. 23 is a cross-sectional view illustrating the structure of a semiconductor device according to an eighth preferred embodiment.

FIG. 23 is a cross-sectional view illustrating the structure of a semiconductor device according to an eighth preferred embodiment. This embodiment is a modification of the first to sixth preferred embodiments. In the first to sixth preferred embodiments, the n-type second well W2 and the p-type second well W2 are both formed. Whereas in the eighth preferred embodiment, an unnecessary n-type second well W2 or p-type second well W2 is omitted as needed.

FIG. 23 shows the case where the n-type second well W2 is eliminated from the structure of FIG. 9. In FIG. 23, an element isolation film T and a first region R1 are covered with an insulating film 300, and a plurality of n-type first wells W1 are electrically connected one another by a contact 201 and a wiring 202. Therefore, even if the n-type second well W2 is omitted, it is possible to apply a potential to each of the n-type first wells W1.

Thus, the second well W2 is formed on only one side of the second region R2 with reference to the boundary BL.

Figure 17:
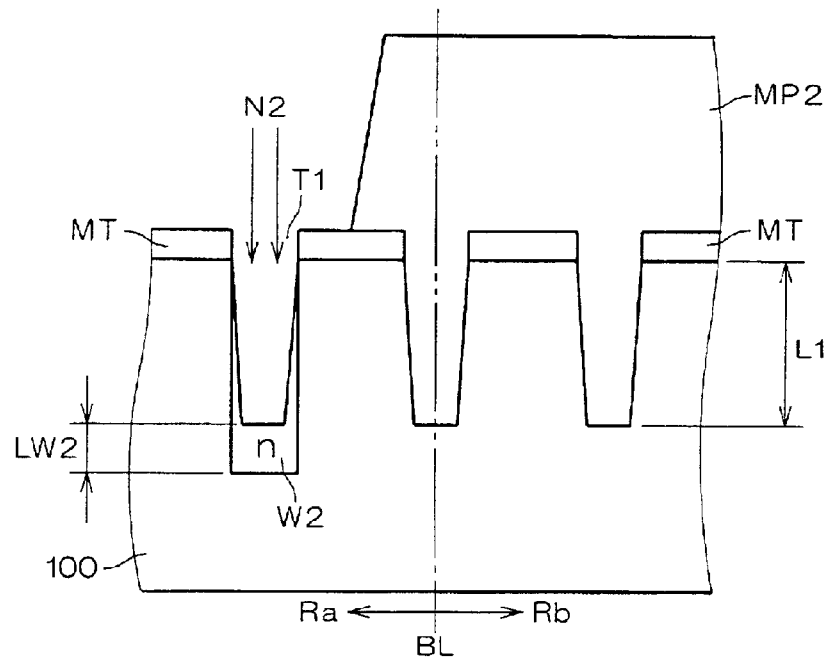

It is possible to simplify the process and reduce the manufacturing cost by the omission of either the p-type second well W2 or the n-type second well W2. For instance, the step of implanting the impurity N2 as shown in FIG. 6 can be omitted in the second preferred embodiment, and the step of forming the resist MP2 and the step of implanting the impurity N2 as shown in FIGS. 12 and 17 can be omitted in the fourth and sixth preferred embodiments, respectively.

Ninth Preferred Embodiment

A ninth preferred embodiment relates to the foregoing embodiments 1 to 8. There is no need to provide a second well W2 for each of elements to be formed in a semiconductor substrate 100, and the second well W2 may be formed for an element which necessitates the formation of the second well W2. It is possible to simplify the process and reduce the manufacturing cost by selecting an element for providing a second well W2.

Figure 24:
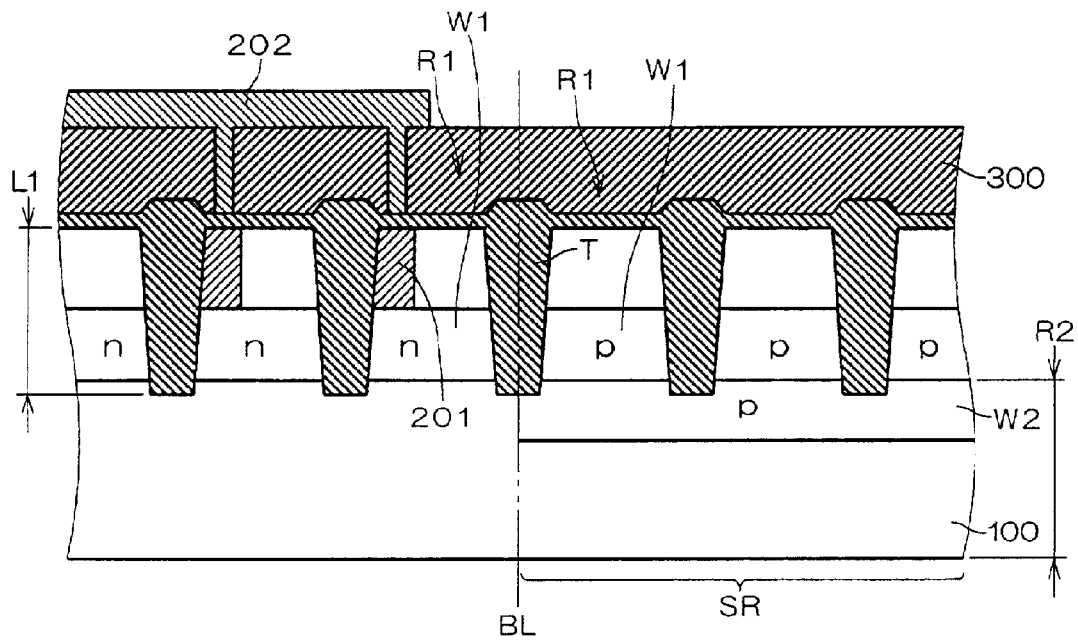
FIG. 24 is a cross-sectional view illustrating the structure of a semiconductor device according to a ninth preferred embodiment.

When a semiconductor device is a SRAM, a second well W2 may be provided in a memory cell part SR, as shown in FIG. 24. The references used for FIG. 23 are used again FIG. 24.

As been well known, a memory cell is the minimum unit of memory storage, and it is a region for storing one bit, for example. The term "memory cell region" is understood to mean a region in which a memory cell is provided.

Figure 25:
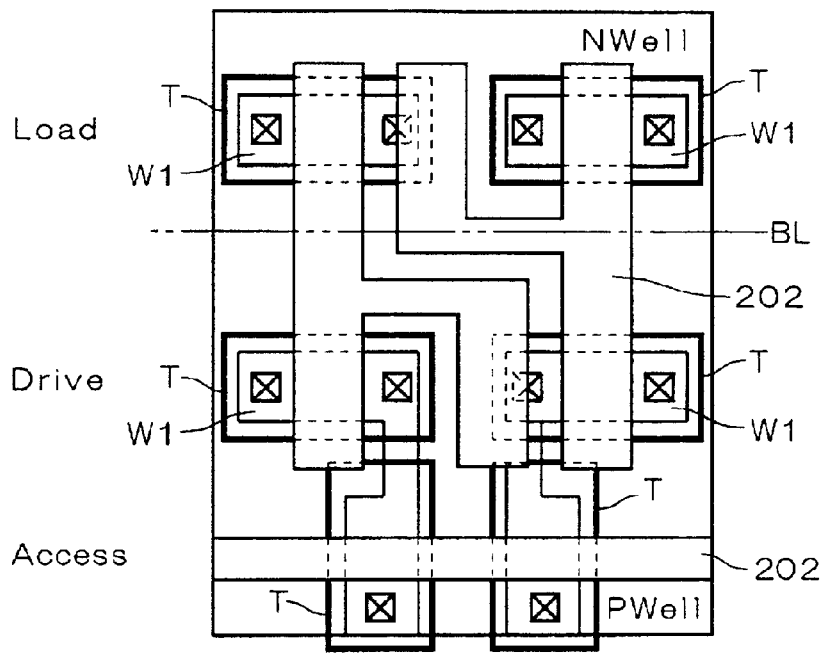
FIGS. 25 and 26 are plan views illustrating the structure of a semiconductor device of the ninth preferred embodiment.
Figure 26:
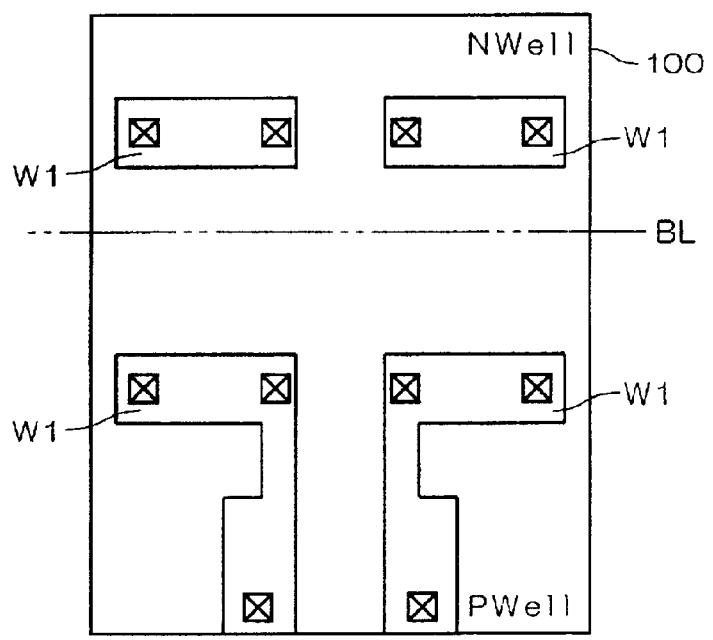

FIG. 25 shows one example of plan views of a single memory cell in an SRAM. The references used for FIG. 24 are used again FIG. 25. FIG. 26 shows the structure that is obtained by eliminating a wiring 202 and an element isolation film T from the structure of FIG. 25. In an SRAM, there are formed, for example, several millions of the unit of the structure of FIG. 26. It is therefore extremely effective to select the memory cell part SR for providing the second well W2. That is, the second well W2 is provided only for the memory cell part SR in a plurality of elements in the SRAM, and the second wells W2 is omitted for other elements, thus simplifying the process and reducing the manufacturing cost. In addition, there is no need to provide a contact 201 for each of, for example, several millions memory cells, leading to an extremely small layout area.

Tenth Preferred Embodiment

Figure 27:
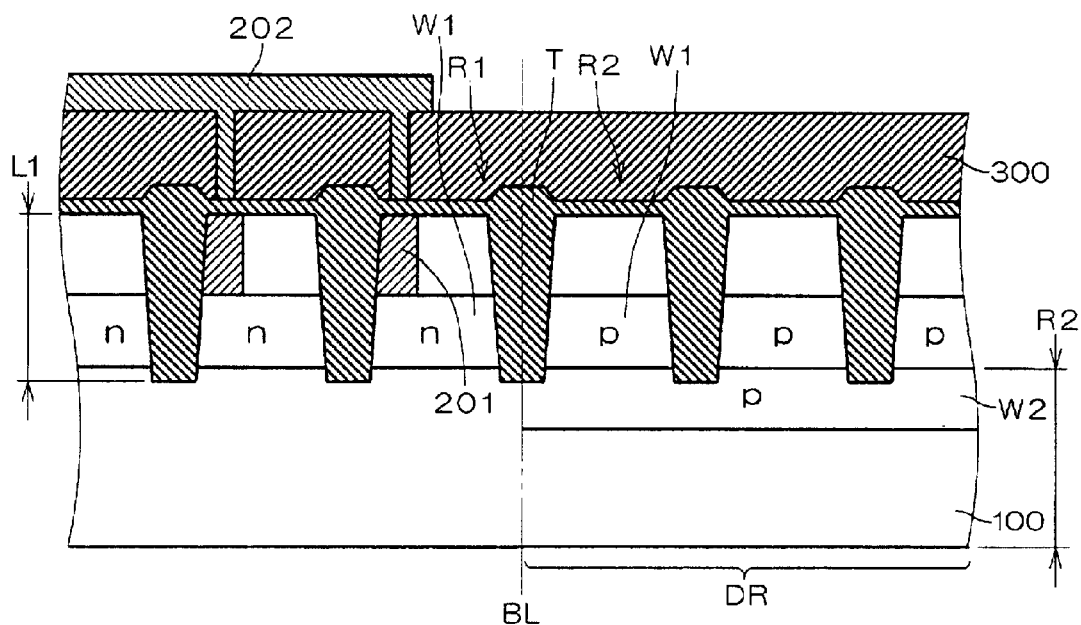
FIG. 27 is a cross-sectional view illustrating the structure of a semiconductor device according to a tenth preferred embodiment.

FIG. 27 is a cross-sectional view illustrating the structure of a semiconductor device according to a tenth preferred embodiment. FIG. 24 shows the case where the second well W2 is provided in the memory cell part SR of the SRAM. In addition to this, a second well W2 may be provided in a memory cell part DR of a DRAM in this embodiment.

Eleventh Preferred Embodiment

Figure 28:
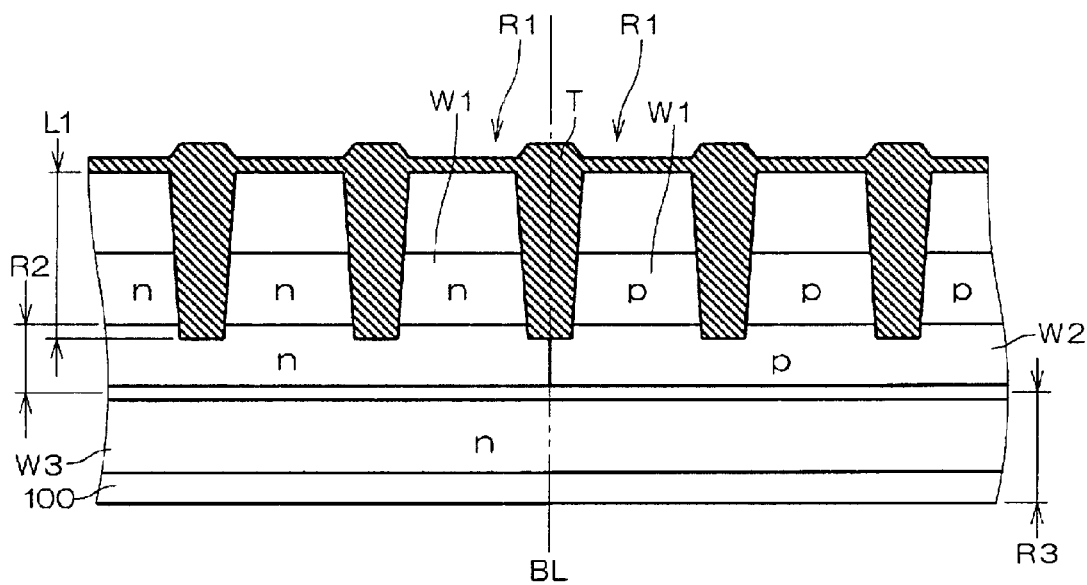
FIG. 28 is a cross-sectional view illustrating the structure of a semiconductor device according to an eleventh preferred embodiment.
Figure 29:
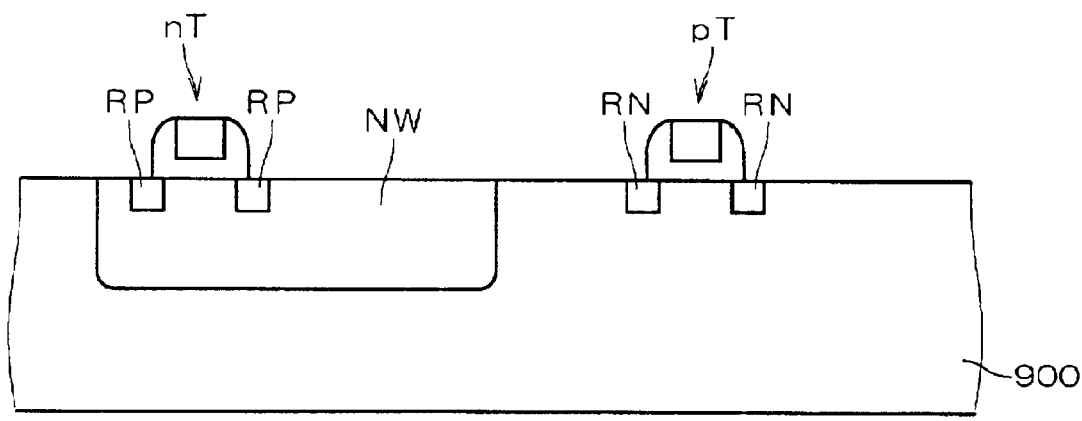
Figure 30:
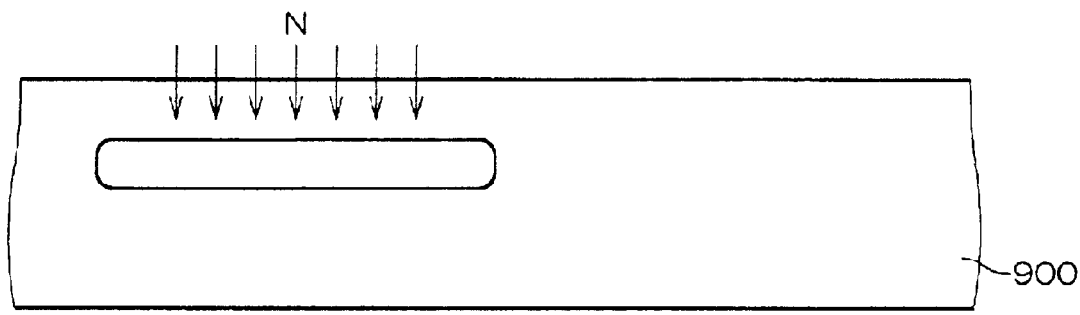
Figure 3:
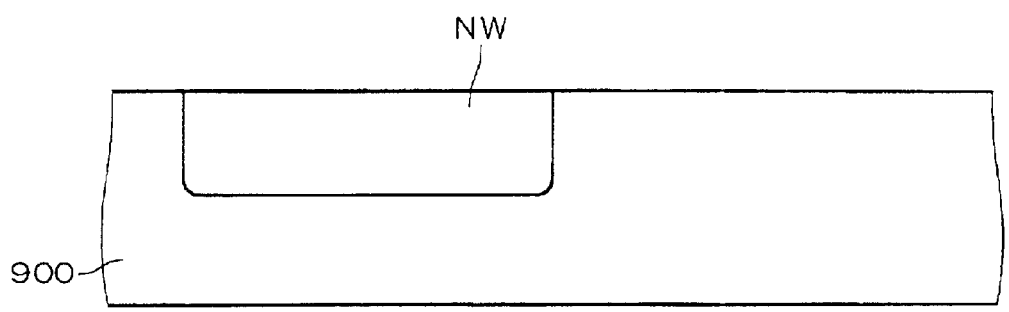
Figure 3:
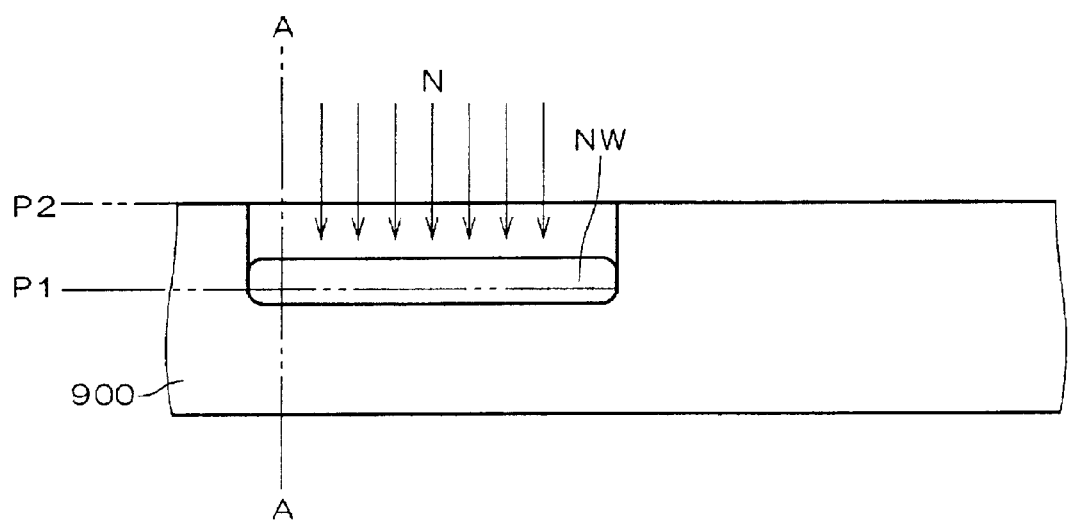
Figure 33:
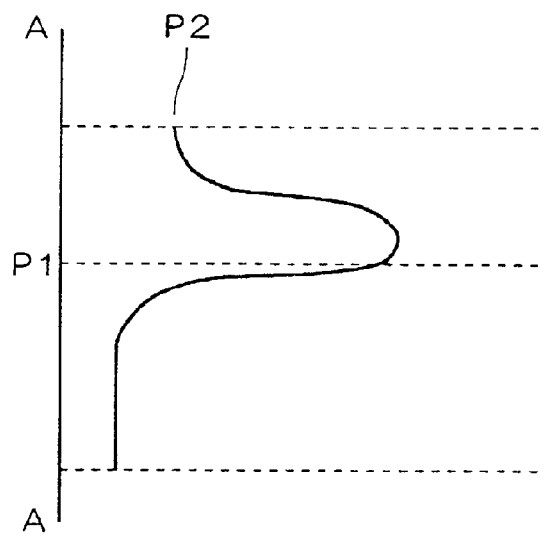
FIG. 33 is a graph showing the impurity concentration of a well in a conventional semiconductor device.
Figure 34:
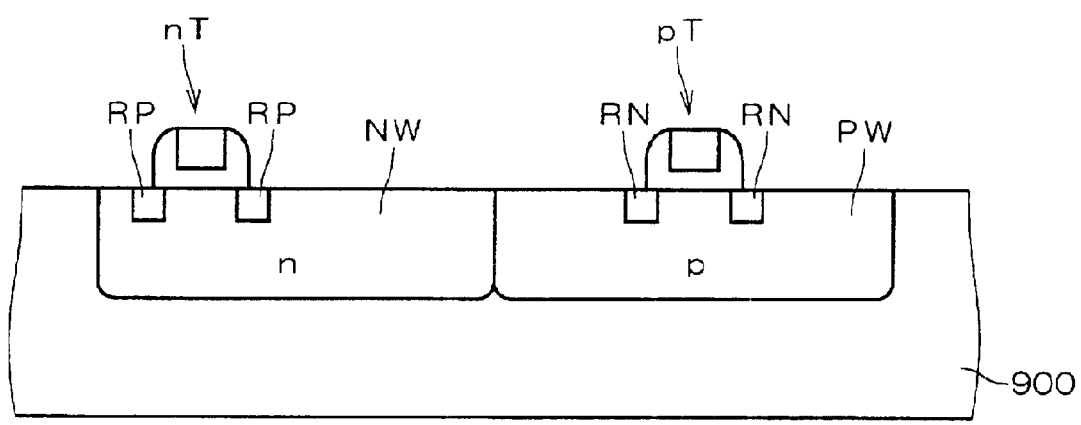
Figure 35:
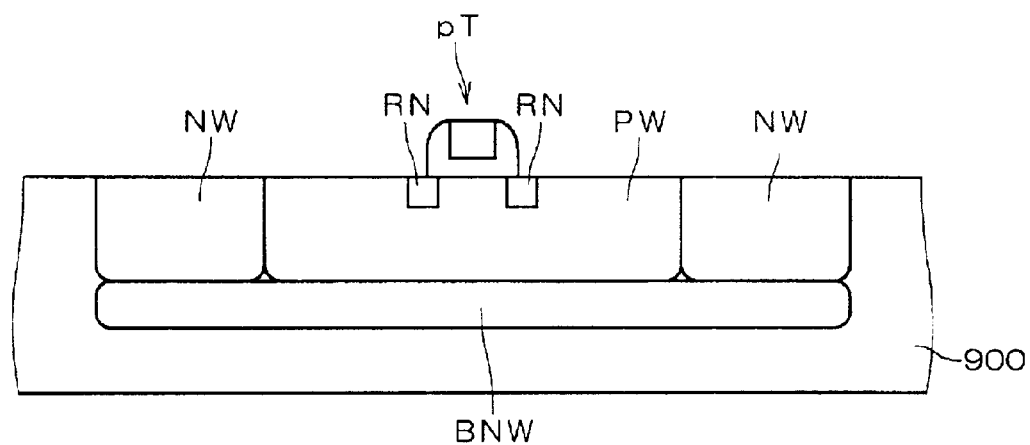

FIG. 28 is a cross-sectional view illustrating the structure of a semiconductor device according to an eleventh preferred embodiment. This embodiment is a modification of the foregoing embodiments 1 to 10. In the tenth preferred embodiment, a third well W3 is further provided in a third region R3 deeper than a second region R2 in a semiconductor substrate 100.

FIG. 28 indicates the case where an n-type third well W3 is added to the structure of FIG. 9, for example. Thereby, first and second wells W1 and W2 can be electrically isolated with each other from a region lower than the third well W3. This enables to individually set the potential of the first and second wells W1 and W2 from the potential at a position lower than the third well W3. It is also possible to utilize the third well W3 as a countermeasure for soft errors (i.e., the phenomenon that the storage contents of a memory is vanished).

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a semiconductor substrate;

an element isolation film formed such as to have a predetermined depth from a main surface of said semiconductor substrate, said element isolation film dividing the area from said main surface to said depth into a plurality of first regions;

first wells formed in said first regions, respectively; and a second well formed in a second region deeper than said first wells in said semiconductor substrate, said second well being in contact with a plurality of said first wells, wherein said first and second wells of said first and second regions on one side with reference to a predetermined boundary are of a first conductivity type, and said first and second wells on the other side are of a second conductivity type, and wherein the second well on one side of the predetermined boundary has a higher concentration than the first wells on said one side.

2. A semiconductor device according to claim 1 wherein a single element is formed in a single first region.

3. A semiconductor device according to claim 1 wherein the second well is in contact with all of the first wells.

4. A semiconductor device comprising:

a semiconductor substrate;

an element isolation film formed such as to have a predetermined depth from a main surface of said semiconductor substrate, said element isolation film dividing the area from said main surface to said depth into a plurality of first regions;

first wells formed in said first regions, respectively; and a second well formed in a second region deeper than each of said first wells in said semiconductor substrate, said second well being in contact with some of said first wells to provide electrical connection therebetween and not being in contact with said first wells adjacent to said some of said first wells, wherein said first and second wells of said first and second regions on one side with reference to a predetermined boundary are of a first conductivity type, and said first wells on the other side are of a second conductivity type, and wherein said second well is formed only on one side of said second region with reference to the predetermined boundary.

5. A semiconductor device according to claim 4 wherein said second well is formed in a memory cell part in said second region.

6. A semiconductor device according to claim 4 wherein a single element is formed in a single first region.

7. A semiconductor device comprising:

a semiconductor substrate;

a plurality of element isolation films formed such as to have a predetermined uniform depth from a main surface of said semiconductor substrate, said element isolation films dividing the area from said main surface to said depth into a plurality of first regions;

first wells formed in said first regions, respectively; and a second well formed in a second region deeper than each of said first wells in said semiconductor substrate, said second well being in contact with some of said first wells to provide electrical connection therebetween and not being in contact with said first wells adjacent to said sonic of said first wells, wherein said first and second wells of said first and second regions on one side with reference to a predetermined boundary are of a first conductivity type, and said first wells on the other side are of a second conductivity type, and wherein said second well is fanned only on one side of said second region with reference to the predetermined boundary, and wherein the first wells are separated from each other via the element isolation films.

8. A semiconductor device according to claim 7, wherein said second well is formed in a memory cell part in said second region.

9. A semiconductor device according to claim 7 wherein a single element is formed in a single first region.

* * * * *